(12) United States Patent
Hung et al.

(10) Patent No.: US 11,749,572 B2
(45) Date of Patent: Sep. 5, 2023

(54) TESTING BONDING PADS FOR CHIPLET SYSTEMS

(71) Applicant: Macronix International Co., Ltd., Hsinchu (TW)

(72) Inventors: Chun-Hsiung Hung, Hsinchu (TW); Su-Chueh Lo, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 553 days.

(21) Appl. No.: 16/877,697

(22) Filed: May 19, 2020

(65) Prior Publication Data

US 2021/0366793 A1 Nov. 25, 2021

(51) Int. Cl.
*H01L 21/66* (2006.01)
*G01R 31/28* (2006.01)
*H01L 23/00* (2006.01)
*H01L 23/498* (2006.01)

(52) U.S. Cl.
CPC .......... *H01L 22/32* (2013.01); *G01R 31/2896* (2013.01); *H01L 23/49811* (2013.01); *H01L 23/49838* (2013.01); *H01L 24/16* (2013.01); *H01L 2224/1623* (2013.01)

(58) Field of Classification Search
CPC ............... H01L 22/32; H01L 23/49811; H01L 23/49838; H01L 2224/0401; H01L 2224/0616; H01L 2224/16227; H01L 2924/00014; H01L 22/14; H01L 22/20; H01L 22/34; G01R 31/2896

See application file for complete search history.

(56) References Cited

U.S. PATENT DOCUMENTS

| | | | | |
|---|---|---|---|---|
| 4,393,464 | A | * 7/1983 | Knapp | ................ H01L 27/0207 257/923 |
| 10,453,759 | B2 | 10/2019 | Iguchi | |
| 2004/0075157 | A1* | 4/2004 | Konishi | ............. H01L 23/5286 257/E23.153 |
| 2004/0257846 | A1* | 12/2004 | Lee | ........................ G11C 16/10 365/30 |

(Continued)

FOREIGN PATENT DOCUMENTS

WO    WO 2017/043216    3/2017

*Primary Examiner* — Christopher P McAndrew
*Assistant Examiner* — Zannatul Ferdous
(74) *Attorney, Agent, or Firm* — Fish & Richardson P.C.

(57) ABSTRACT

Systems, methods, circuits, and apparatus including computer-readable mediums for testing bonding pads in multi-die packages, e.g., chiplet systems. An example integrated circuit device includes an integrated circuit, first type bonding pads and second type bonding pads. Each of the first type bonding pads is electrically connected to the integrated circuit and configured to be electrically connected to a corresponding external integrated circuit device. Each of the second type bonding pads is configured to have no electrical connection with the corresponding external integrated circuit device. Each of the first type bonding pads is configured to be electrically connected to a corresponding one of the second type bonding pads. A number of the first type bonding pads can be larger than a number of the second type bonding pads. Each of the second type bonding pads can have a larger pad area for probing than each of the first type bonding pads.

23 Claims, 12 Drawing Sheets

(56) References Cited

U.S. PATENT DOCUMENTS

| | | | |
|---|---|---|---|
| 2011/0050273 A1* | 3/2011 | Ma | H01L 22/32 |
| | | | 324/762.05 |
| 2014/0264337 A1* | 9/2014 | Chen | H01L 23/5386 |
| | | | 438/15 |
| 2018/0254226 A1* | 9/2018 | Iguchi | H01L 27/156 |
| 2020/0335044 A1* | 10/2020 | Kawachi | G09G 3/3275 |
| 2022/0189834 A1* | 6/2022 | Lin | H01L 24/82 |

\* cited by examiner

TESTING BONDING PADS FOR CHIPLET SYSTEMS

BACKGROUND

A multi-die package or stacked-die package-based device can enclose a number of integrated circuits (IC) in a chip carrier package to maximize capacities and performances. However, a monolithic integrated system on chip (SoC) has some drawbacks, such as high initial prototype costs and requirements for alternative material sets.

To enhance an overall system flexibility and reduce design time for products, chiplet systems have been developed to do heterogeneous integration and form system-level assemblies, which can enable low cost and short electric signal routing to achieve high performance. Before packaging, the IC devices on wafers need to go through wafer-level testing. After the wafer-level testing, the wafers are cut into multiple dies, which are picked to be packaged into chiplet systems. There can be lots of connection wires between these picked dies. The bonding pads on the dies have to be small enough to support the large amount of connections. However, a small bonding pad cannot be probed and signals on the bonding signal may not be measurable during the wafer-level testing. Therefore, it would be desirable to develop IC devices where bonding pads can be tested at a wafer level to make sure functions work properly before packaging.

SUMMARY

The present disclosure describes systems and techniques for testing bonding pads, for example, those connecting different integrated circuit devices (or dies) in chiplet systems.

One aspect of the present disclosure features an integrated circuit device including: an integrated circuit; a plurality of first type bonding pads electrically connected to the integrated circuit, each of the first type bonding pads being configured to be electrically connected to a corresponding external integrated circuit device; and a second type bonding pad configured to have no electrical connection with the corresponding external integrated circuit device, each of the first type bonding pads being configured to be electrically connected to the second type bonding pad.

A pad area of the second type bonding pad can be larger than a pad area of each of the first type bonding pads. The integrated circuit can be electrically connected to each of the first type bonding pads via a respective buffer.

In some implementations, the integrated circuit device further includes a multiplexer configured to select one of the first type bonding pads based on a selection signal such that the selected one of the first type bonding pads is electrically connected to the second type bonding pad. The integrated circuit can be configured to provide the selection signal to the multiplexer. The multiplexer can be electrically connected to corresponding electrical contacts between the integrated circuit and the respective buffers.

In some implementations, each of the first type bonding pads is electrically connected to the multiplexer via a respective electrical connection, and the second type bonding pad is electrically connected to the multiplexer via a second buffer that is different from the respective buffers for the first type bonding pads.

The integrated circuit device can further include a plurality of latch circuits. Each of the first type bonding pads can be electrically connected to the multiplexer via a respective latch circuit of the plurality of latch circuits. The plurality of latch circuits can be configured to receive a control signal and configured to: simultaneously latch signals on the plurality of first type bonding pads when the control signal is at a first state and separately update the signals on the plurality of first type bonding pads when the control signal is at a second state different from the first state.

In some embodiments, the multiplexer is configured to: when the control signal remains at the first state, sequentially select the first type bonding pads to be electrically connected with the second type bonding pad such that the simultaneously latched signals in the plurality of latch circuits are sequentially provided to the second type bonding pad.

In some embodiments, the integrated circuit device further includes a plurality of latch circuits, and each of the first type bonding pads can be configured to be electrically connected to the second type bonding pad via a respective latch circuit of the plurality of latch circuits.

Each of the plurality of latch circuits can be configured to receive a switching signal and configured to: electrically isolate the second type bonding pad from a corresponding first type bonding pad electrically connected with the latch circuit when the switching signal is an off signal, and electrically connect the second type bonding pad to the corresponding first type bonding pad with the latch circuit when the switching signal is an on signal.

In some embodiments, each of the plurality of latch circuits is configured to receive a respective control signal and configured to: update a signal from the second type bonding pad to the corresponding first type bonding pad when the switching signal is the on signal and the respective control signal is at a first state, and latching the signal from the second type bonding pad to the corresponding first type bonding pad when the switching signal is the on signal and the respective control signal is at a second state different from the first state. The integrated circuit can be configured to provide the switching signal and the respective control signals to the plurality of latch circuits.

In some implementations, the integrated circuit includes: an input configured to be electrically connected to the second type bonding pad via a first buffer, and an output configured to be electrically connected to the second type bonding pad via a second buffer different from the first buffer.

In some implementations, the first type bonding pads include: a plurality of output type bonding pads each configured to transmit internal data from the integrated circuit to the corresponding external integrated circuit device; and a plurality of input type bonding pads each configured to receive external data from the corresponding external integrated circuit device.

In some embodiments, the integrated circuit device further includes: a multiplexer electrically connected to each of the output type bonding pads via a corresponding electrical connection and to the second type bonding pad via a buffer and configured to select one of the output type bonding pads based on a selection signal such that the selected one of the output type bonding pads is electrically connected to the second type bonding pad; and a plurality of latch circuits, where each of the input type bonding pads is configured to be electrically connected to the second type bonding pad via a respective latch circuit of the plurality of latch circuits.

Each of the plurality of latch circuits can be configured to: receive a respective control signal and a respective switching signal, electrically isolate the second type bonding pad from a corresponding input type bonding pad electrically connected with the latch circuit when the respective switching signal is an off signal, and electrically connect the second type bonding pad with the corresponding input type bonding pad with the latch circuit when the respective switching signal is an on signal, such that a signal from the second type bonding pad to the corresponding input type bonding pad is updated when the respective control signal is at a first state and the signal from the second type bonding pad to the input type bonding pad is latched when the respective control signal is at a second state different from the first state.

The integrated circuit device can further include a plurality of second latch circuits, each of the output type bonding pads being electrically connected to the multiplexer via a respective second latch circuit of the plurality of second latch circuits. The plurality of second latch circuits can be configured to receive a second control signal and configured to: simultaneously latch signals on the plurality of first type bonding pads when the second control signal is at the first state and separately update the signals on the plurality of first type bonding pads when the second control signal is at the second state. The integrated circuit can be configured to: provide the selection signal to the multiplexer; provide the respective switching signals and the respective control signals to the plurality of latch circuits; and provide the second control signal to the plurality of second latch circuits.

Another aspect of the present disclosure features an integrated system including: multiple integrated circuit devices electrically connected together. Each of the integrated circuit devices includes: an integrated circuit; a plurality of first type bonding pads electrically connected to the integrated circuit and electrically connected to at least one other of the integrated circuit devices; and a plurality of second type bonding pads having no electrical connection with the at least one other of the integrated circuit devices, where each of the first type bonding pads is configured to be electrically connected to a corresponding one of the second type bonding pads.

The integrated system can further include a carrier board on which the integrated circuit devices are arranged. The carrier board can include a wire routing layer in electrical contact with the first type bonding pads of the integrated circuit devices, and the carrier board can include one or more pins electrically connected to one or more of the first type bonding pads of the integrated circuit devices. On each of the integrated circuit devices, a number of the first type bonding pads can be larger than a number of the second type bonding pads, and each of the first type bonding pads can have a smaller pad area than each of the second type bonding pads.

A further aspect of the present disclosure features a method of testing bonding pads on an integrated circuit device, including: transmitting, from an integrated circuit, a signal to a selected first type bonding pad of a plurality of first type bonding pads, the selected first type bonding pad being configured to be electrically connected to an external integrated circuit device and to transmit internal data from the integrated circuit to the external integrated circuit device; receiving the signal on a second type bonding pad that is electrically connected to the selected first type bonding pad, the second type bonding pad being configured to have no electrical connection with the external integrated circuit device and configured to be electrically connected to each of the first type bonding pads, the second type bonding pad having a larger pad area than each of the first type bonding pads; measuring the signal on the second type bonding pad; and determining a condition of the selected first type bonding pad based on a result of the measuring.

In some implementations, the method further includes: receiving an external signal at the second type bonding pad; controlling a plurality of latch circuits electrically connected to a plurality of third type bonding pads to deliver the external signal from the second type bonding pad to a selected third type bonding pad of the plurality of third type bonding pads; receiving, by the integrated circuit, the external signal from the selected third type bonding pad; outputting, by the integrated circuit, an output signal corresponding to the external signal; and determining a condition of the selected third type bonding pad based on a result of measuring the output signal from the integrated circuit. The selected third type bonding pad can be configured to electrically connectable to a second external integrated circuit device and configured to receive external data from the second external integrated circuit device. The second type bonding pad can be configured to have no electrical connection with the second external integrated circuit device and configured to be electrically connected to each of the third type bonding pads, and each of the third type bonding pads has a smaller pad area than the second type bonding pad.

Another aspect of the present disclosure features an integrated circuit device including: an integrated circuit; a first type bonding pad electrically connected to the integrated circuit, the first type bonding pad being configured to be electrically connected to an external integrated circuit device; and a second type bonding pad configured to be electrically connected to the first type bonding pad and to have no electrical connection with the external integrated circuit device.

The second type bonding pad can be configured to have a size larger than the first type bonding pad. The integrated circuit can be electrically connected to the first type bonding pad via a first buffer and to the second type bonding pad via a second buffer, and the second buffer can be electrically connected to an electrical contact between the integrated circuit and the first buffer.

The integrated circuit can be configured to be electrically connected to the first type bonding pad via a first buffer, and the first type bonding pad can be configured to be electrically connected to the second type bonding pad via a second buffer. The integrated circuit device can include a latch circuit electrically connected to an electrical contact between the first type bonding pad and the second buffer, the latch circuit being configured to receive a control signal. The integrated circuit can be configured to provide the control signal to the latch circuit.

In some implementations, the integrated circuit is be configured to provide a signal to the first type bonding pad, and the latch circuit is configured to: update the signal from the first type bonding pad to the second type bonding pad when the control signal is at a first state, and latch the signal from the first type bonding pad to the second type bonding pad when the control signal is at a second state different from the first state.

In some implementations, the latch circuit is configured to receive a switching signal. The latch circuit can be configured to: electrically isolate the second type bonding pad from the first type bonding pad when the switching signal is an off signal, and electrically connect the second type bonding pad with the first type bonding pad when the switching signal is an on signal, such that a signal from the second type bonding pad to the first type bonding pad is updated when the control signal is at a first state and the signal from the second type bonding pad to the first type bonding pad is latched when the control signal is at a second state different from the first state.

Implementations of the above techniques include methods, systems, circuits, computer program products and computer-readable media. In one example, a method can be performed in a non-volatile memory and the method can include the above-described actions, e.g., the actions for testing bonding pads for chiplet systems. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented for any type of circuits, devices or systems that need testing smaller area bonding pads used for electrical connections between different integrated circuit (IC) devices or those tested at a wafer level and packaged into a multi-die package. For example, there is a requirement that signals on the bonding pads are correct. Before going into packaging, the bonding pads on an IC device has to go through testing on wafer-level. The techniques herein provide an integrated circuit (IC) device (die or chip) that can include two different types of bonding pads: system pads and test pads. The system pads are for signal wire connection among the dies inside the package, and the pad area (or layout size) of the system pads can be small to support a large amount of system connections. The test pads are mainly used for wafer-level testing (or probing) before packaging. The test pads can be left unconnected after packaging. The pad area of the test pads can be large so that it can be probed on wafer-level testing. The number of system pads can be more than the number of test pads. For example, there may be hundreds of system pads on the IC device, while there may be only a few test pads on the IC device. Via the pad type separation, there can be a large amount of wire connections between the dies or chips via small-area system pads while just a few large-area test pads that can be probed on wafer-level testing. Each system pad is electrically connected to a corresponding test pad on the IC device, such that the system pads may be checked without probing but by internally sending signals on the system pads to the test pads or providing signals from the system pads to an internal integrated circuit on the IC device through the test pads. Each test pad can be electrically connected to and test a number of system pads, e.g., via multiplexing or latching technologies. In such a way, the system pads (bonding pads between dies) on the IC device can be fully tested at a wafer level to make sure functions work properly before packaging. By using latching technologies, multiple signals on multiple system pads can be simultaneously sampled at specific time points, which can be used to measure high speed signals.

Compared to traditional IC devices where all the signals on the bonding pads (or system pads) to be bonded out are tested at a wafer level and the bonding pads may be too small to support a large amount of connections and unable to be probed to do accurate signal measurement, the technologies implemented in the present discourse can greatly simplify the wafer level testing and improve detection accuracy and efficiency. Moreover, the technologies can develop chiplet systems with a large number of wire connections between different ICs, which can form complicated heterogeneous IC integrations or system-level assemblies for enhancing overall system flexibility and reducing design time, and can enable low cost and short electric signal routing to achieve high performance.

The techniques can be applied to form various types of non-volatile memory devices, such as NAND flash memory, NOR flash memory, resistive random-access memory (RRAM), phase-change random-access memory (PCRAM), among others. Additionally or alternatively, the techniques can be applied to form various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

DETAILED DESCRIPTION

Figure 1:
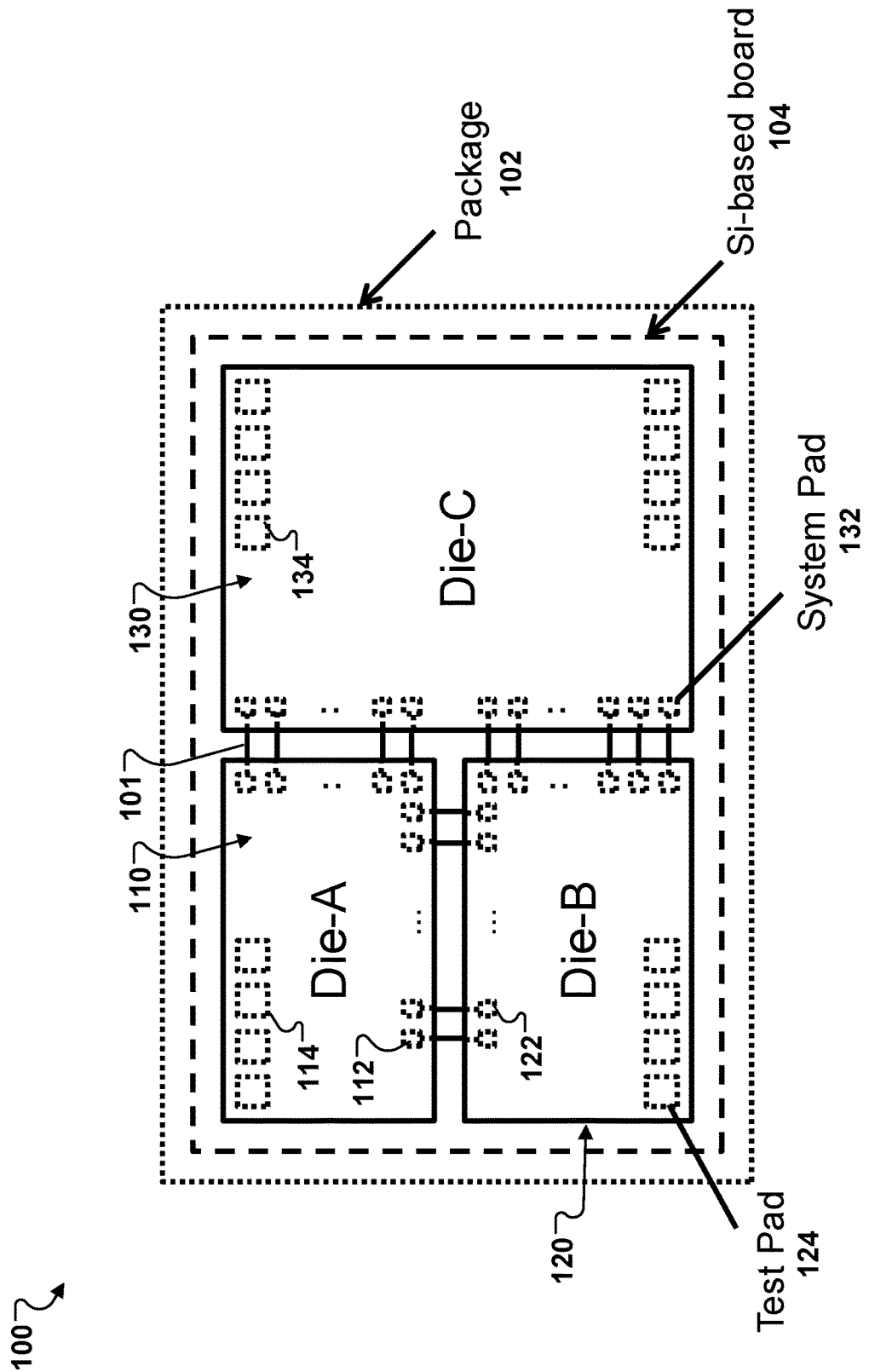
FIG. 1 is a schematic diagram of an example chiplet system that packages multiple integrated circuit devices (or dies), according to one or more implementations.

FIG. 1 is a schematic diagram of an example chiplet system 100 that packages multiple integrated circuit devices (or dies), according to one or more implementations. As illustrated in FIG. 1, the chiplet system 100 is a system-level assembly that packages multiple integrated circuit devices, for example, integrated circuit devices described with further details and illustrated in FIGS. 2A-2D, 5A-5C, and 6A-6C.

As illustrated in FIG. 1, the chiplet system 100 includes a package 102 packaging three dies Die-A 110, Die-B 120, and Die-C 130 that are integrated on a silicon-based carrier board 104. The chiplet system 100 can include a number of pins, for example, on the silicon-based board 104, that can be configured to receive external signals from external devices or systems or transmit signals out to external devices or systems.

Each die can be an integrated circuit device that includes an internal integrated circuit (or internal circuit) and bonding pads. During integrating and packaging, the three dies 110, 120, 130 are flipped over (or facing downward) with respect to the silicon-based board 104, such that contacts of bonding pads of the three dies are in electrical contact with a wire routing layer (or interposer) on the silicon-based board 104, for example, through micro-bump technology.

The bonding pads on each die can include two types of bonding pads: first type bonding pads (referred as system pads) and second type bonding pads (referred as test pads). For illustration purposes only in the present disclosure, the first type bonding pads and the second type bonding pads are referred as system pads and test pads, respectively. The system pads are configured for signal wire connection among the dies inside the package, and the system pads are configured not to be used for probing during wafer-level testing before packaging. Some of the system pads are connected out to the pins of the chiplet system, while some others of the system pads are not connected out to the pins. The test pads are configured to be mainly used for probing during the wafer-level testing before the packaging, and the test pads are configured to have no connection with any other dies in the package and can be left unconnected after the packaging.

A system pad can be electrically connected to a corresponding test pad on the same die, such that the system pad can be checked or tested without being probed during wafer-level testing. The system pad can be an output type system pad or an input type system pad. In some cases, the system pad is a hybrid pad that functions as an output type system pad under some conditions and as an input type system pad under other conditions. The output type system pad is configured to transmit signals or internal data from an internal circuit in the die to an external die, and can be tested during the wafer-level testing by internally sending a signal from the internal circuit to the system pad to the test pad. The input type system pad is configured to receive signals or external data from an external die to the internal circuit in the die, and can be tested during the wafer-level testing by providing an external signal from the test pad through the system pad to the internal circuit. A test pad can be electrically connected to a number of system pads, e.g., via multiplexing or latching technologies as discussed with further details in FIGS. 5A-5C and 6A-6C, and used for testing the number of system pads during the wafer-level testing.

As a system pad on a die is not used for probing during wafer-level testing, the system pad can have a smaller size (bonding area or pad area) such that the die can include a larger number of system pads for external connections with external dies. A test pad on the same die can have a larger size than the system pad, such that the test pad can be probed on wafer-level testing. In the chiplet system 100, the test pad used for probing can have one or more probing scratches, while the system pad keeps smooth without scratches. On the same die, the number of system pads on the die can be larger than the number of test pads. For example, in the same die, there can be hundreds of system pads, while there may be only one or a few test pads. In some examples, all the system pads are electrically connected to the test pads on the same die. In some other examples, some of the system pads are electrically connected to the test pads on the same die, while the others of the system pads are not connected to any of the test pads.

As illustrated in FIG. 1, Die-A 110 includes a number of system pads 112 and a number of test pads 114. Each of the system pads 112 can be electrically connected to a corresponding one of the test pads 114, and can be tested by using the corresponding test pad 114 during wafer-level testing of Die-A 110 before packaging into the package 102. Die-B 120 includes a number of system pads 122 and a number of test pads 124. Each of the system pads 122 can be electrically connected to a corresponding one of the test pads 124, and can be tested by using the corresponding test pad 124 during wafer-level testing of Die-B 120 before packaging into the package 102. Die-C 130 includes a number of system pads 132 and a number of test pads 134. Each of the system pads 132 can be electrically connected to a corresponding one of the test pads 134, and can be tested by using the corresponding test pad 134 during wafer-level testing of Die-C 130 before packaging into the package 102.

After the packaging, the system pads 112 on Die-A 110 are electrically connected to the system pads 122 on Die-B 120 and to the system pads 132 on Die-C 130, by connection wires 101, while the test pads 114 on Die-A 110 are left unconnected to Die-B 120 and Die-C 130. After the packaging, the system pads 122 on Die-B 120 are electrically connected to the system pads 112 on Die-A 110 and to the system pads 132 on Die-C 130, by connection wires 101, while the test pads 124 on Die-B 120 are left unconnected to Die-A 110 and Die-C 130. After the packaging, the system pads 132 on Die-C 130 are electrically connected to the system pads 112 on Die-A 110 and to the system pads 122 on Die-B 120, by connection wires 101, while the test pads 134 on Die-C 130 are left unconnected to Die-A 110 and Die-B 120.

Figure 2A:
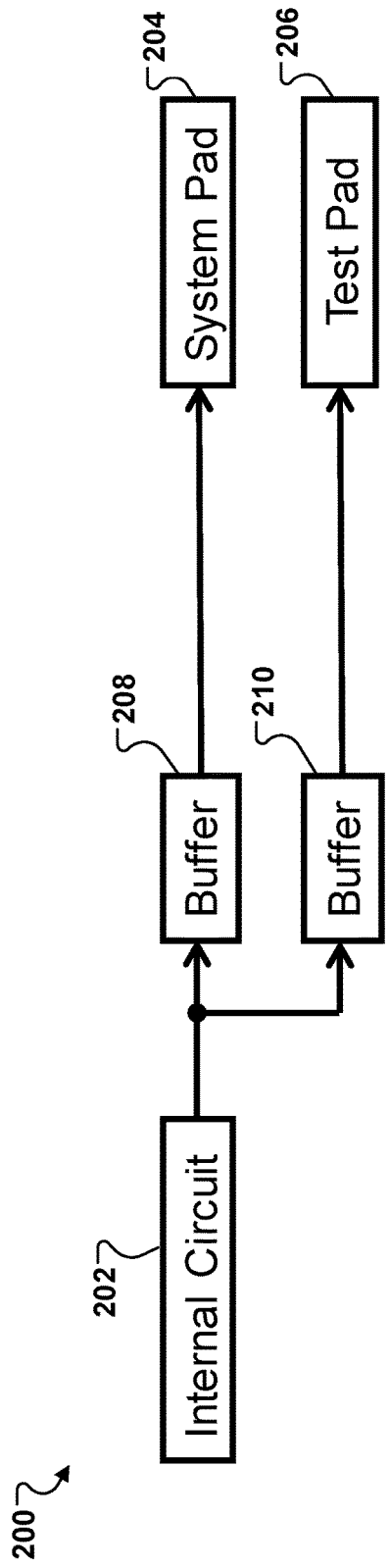
FIG. 2A is a schematic diagram of an example integrated circuit device for testing an output type system pad using a test pad, according to one or more implementations.

FIG. 2A is a schematic diagram of an example integrated circuit (IC) device 200 for testing an output type system pad using a test pad, according to one or more implementations. The IC device 200 can be Die-A 110, Die-B 120, or Die-C 130 of FIG. 1. The IC device 200 includes an internal circuit (or internal integrated circuit) 202, a system pad 204, and a test pad 206. The system pad 204 can be the system pad 112, 122, or 132 of FIG. 1, and the test pad 206 can be the test pad 114, 124, or 134 of FIG. 1. The system pad 204 is an output type system pad configured to transmit signals from the internal circuit 202 to an external integrated circuit device or die. The IC device 200 can be configured for checking the system pad 204 during wafer-level testing by using the test pad 206, for example, by internally sending a signal on the system pad 204, which is from the internal circuit 202, to the test pad 206.

As illustrated in FIG. 2A, the internal circuit 202 is electrically connected to the system pad 204 via a buffer 208, and electrically connected to the test pad 206 via a buffer 210. During wafer-level testing, when the internal circuit 202 sends a signal to the system pad 204 via the buffer 208, the signal is also sent or delivered to the test pad 206 via the buffer 210. The test pad 206 can be probed and the signal on the test pad 206 can be measured, e.g., by an external measurement device, and the signal on the system pad 204 can be determined based on a result of the measurement of the signal on the test pad 206. That is, the result of the measurement can be used to determine whether the signal on the system pad 204 is correct or whether the system pad 204 and/or a circuit path from the internal circuit 202 to the system pad 204 works properly.

The buffer 208 can be configured to amplify the signal from the internal circuit 202 and convert a logic type for the internal circuit 202 into a logic type for the system pad 204. The buffer 210 can be configured to convert the logic type for the internal circuit 202 into a logic type for the test pad 206. The buffer 210 can be also configured to disconnect from the internal circuit 202 so that the test pad 206 is blocked or isolated from the internal circuit 202 and the system pad 204 during a normal operation after the wafer-level testing.

Figure 2B:
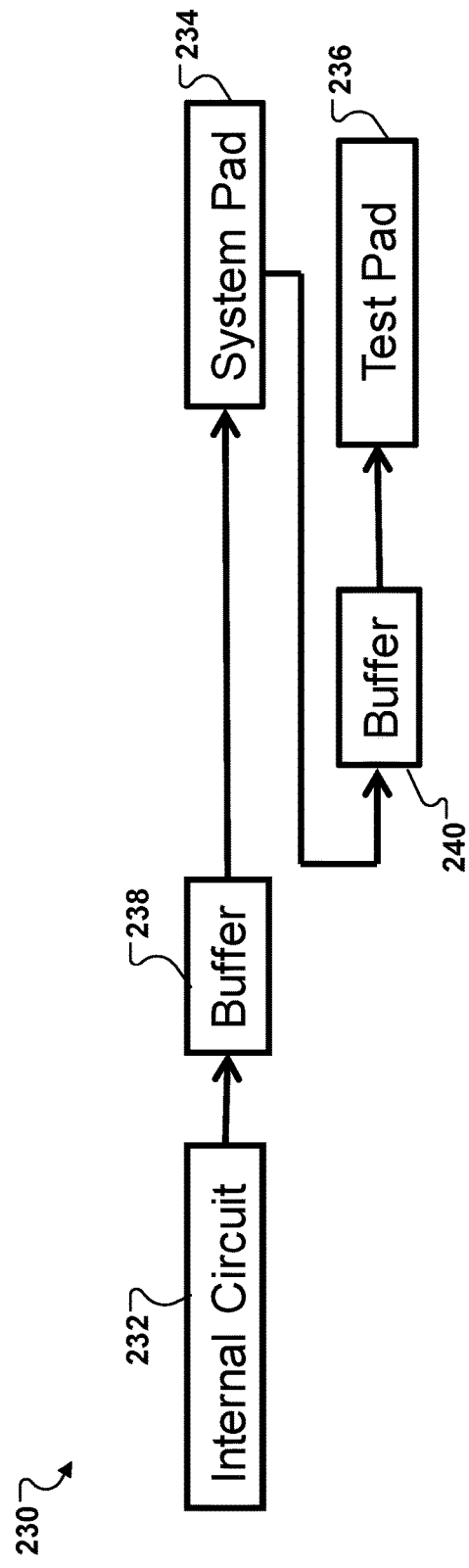
FIG. 2B is a schematic diagram of another example integrated circuit device for testing an output type system pad using a test pad, according to one or more implementations.

FIG. 2B is a schematic diagram of another example integrated circuit (IC) device 230 for testing an output type system pad 234 using a test pad 236, according to one or more implementations. The IC device 230 includes an internal circuit 232 electrically connected to the system pad 234 via a buffer 238. The internal circuit 232, the system pad 234, and the buffer 238 can be similar to the internal circuit 202, the system pad 204, and the buffer 208 in FIG. 2A, respectively.

Different from the IC device 200 in FIG. 2A where the test pad 206 is electrically connected to the internal circuit 202 through the buffer 210, the IC device 230 includes the test pad 236 that is electrically connected to the system pad 234 via a buffer 240, instead. The test pad 236 and the buffer 240 can be similar to the test pad 206 and the buffer 210 of FIG. 2A. During wafer-level testing, a signal is sent from the internal circuit 232 to the system pad 234 via the buffer 238, and then is delivered from the system pad 234 to the test pad 236 via the buffer 240. The signal on the test pad 236 can be measured, and the signal on the system pad 234 can be determined based on a result of the measurement of the signal on the test pad 236. In such a way, the system pad 234, a path from the buffer 238 to the system pad 234, and/or a path from the internal circuit 232 to the system pad 234 can be also checked or tested during the wafer-level testing.

Figure 2C:
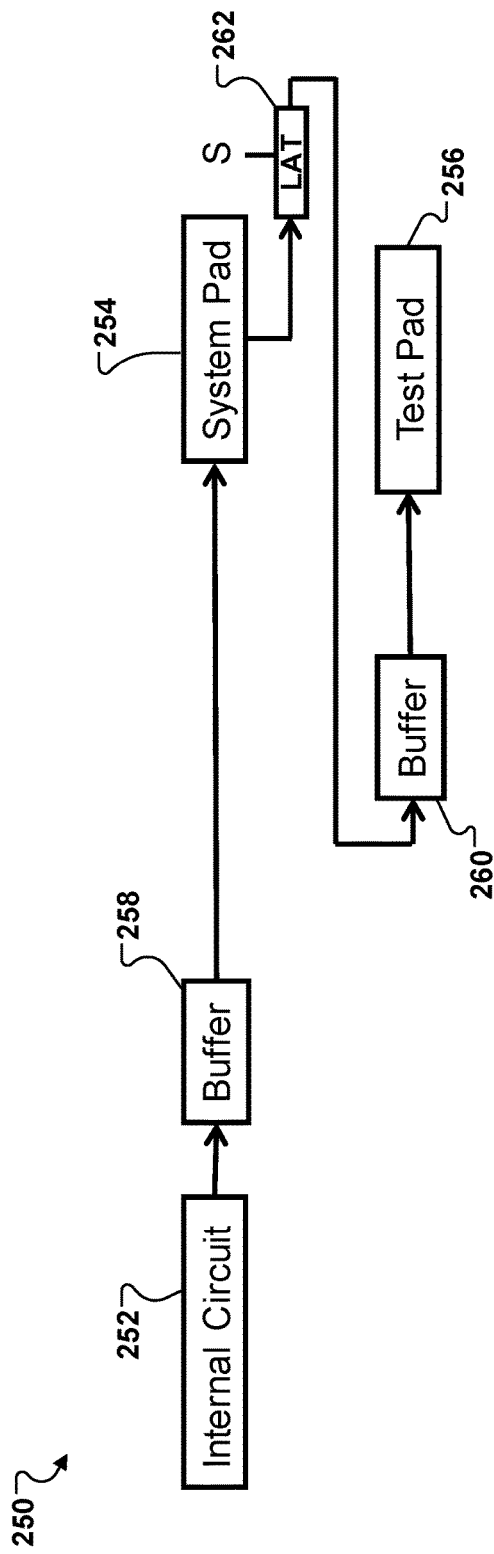
FIG. 2C is a schematic diagram of a further example integrated circuit device for testing an output type system pad using a test pad, according to one or more implementations.

FIG. 2C is a schematic diagram of a further example integrated circuit (IC) device 250 for testing an output type system pad 254 using a test pad 256, according to one or more implementations. The IC device 250 is similar to the IC device 230 in FIG. 2B, and includes an internal circuit 252 that is electrically connected to the system pad 254 via a buffer 258, and the system pad 254 is electrically connected to the test pad 256 via a buffer 260. Different from the IC device 230 in FIG. 2B, the IC device 250 includes a latch circuit 262 arranged between the system pad 254 and the buffer 260. The latch circuit 262 is configured to latch a signal on the system pad 254 (e.g., a signal from the internal circuit 252 to the system pad 254) to the test pad 256 by a control signal input from an input S. In such a way, the signal on the system pad can be sampled at a specific time point controlled by the control signal from the input S and the sampled signal can be delivered to the test pad 256 for testing.

Figure 3:
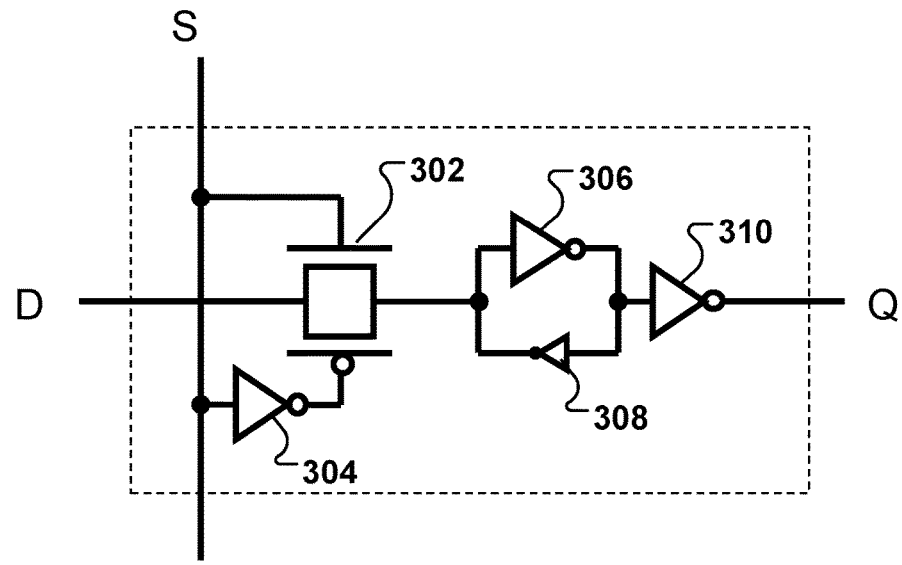
FIG. 3 shows a circuit diagram of an example latch (LAT) circuit, according to one or more implementations.

FIG. 3 shows a circuit diagram of an example latch (LAT) circuit 300, according to one or more implementations. The latch circuit 300 can be used as the latch circuit 262 in FIG. 2C. The latch circuit 300 includes a switching component having a switch 302 and an inverter 304, a latching component having a larger inverter 306 and a smaller inverter 308, and an inverter 310. The latch circuit 300 includes a first input S for receiving a control signal, a second input D for receiving an input signal, e.g., a signal on a system pad, and an output Q for outputting a signal latched in the latching component.

The switch 302 and the inverter 304 are coupled together and configured to both receive the control signal from the first input S. When the control signal keeps high at "1", the switching component is open and the input signal from the input D goes to the latching component. As the smaller inverter 308 has a weaker drive capability than the larger inverter 306, the input signal from the input D can over write a previous stored signal, and is output at the output Q. When the control signal goes low from "1" to "0" at a specific time point, the switching component is closed and the input D is disconnected from the latching component and the output Q keeps outputting the signal stored in the latching component. That is, the input signal is sampled at the specific time point.

Referring back to FIG. 2C, during a wafer-level testing, the internal circuit 252 transmits a signal to the system pad 254 through the buffer 258, and then the signal on the system pad 254 is delivered to the test pad 256 through the latch circuit 262 and the buffer 260. A control signal can be sent, e.g., by the internal circuit 272, to the input S of the latch circuit 262. The control signal remains high at "1", so that the signal on the system pad 254 can be measured in real time at the test pad 256. When the control signal turns low from "1" to "0" at a specific time point, the signal on the system pad 254 is latched in the latch circuit 262 and sampled at the specific time point, and the sampled signal is kept delivering to the test pad 256 for measurement. In such a way, the signal on the system pad 254 at the specific time point can be tested.

Figure 2D:
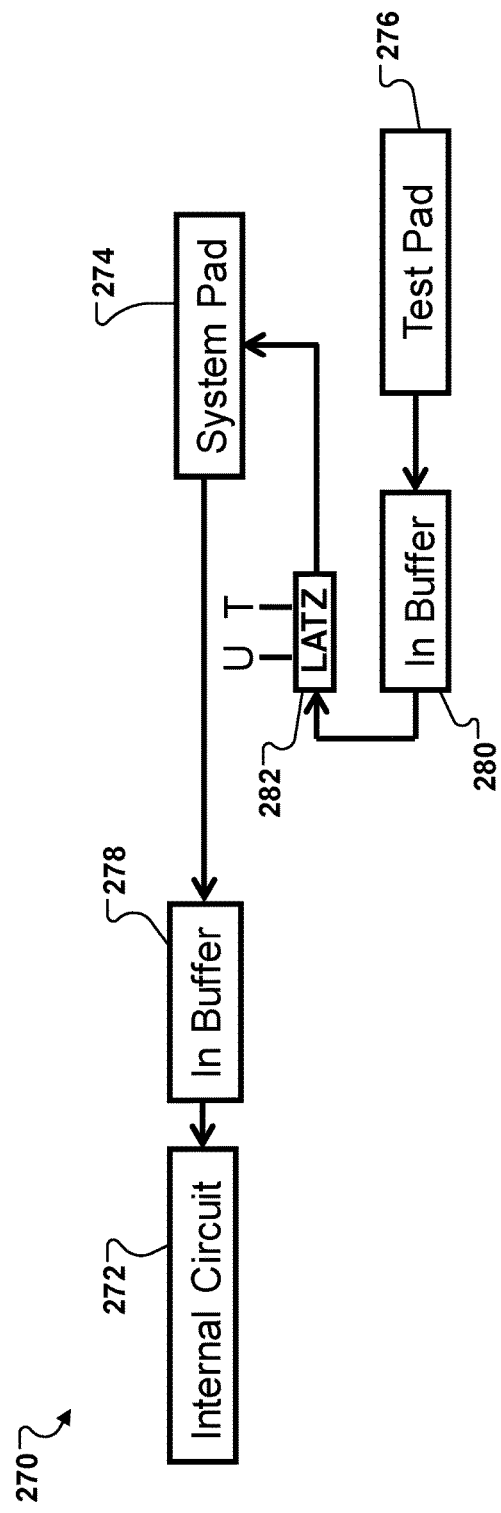
FIG. 2D is a schematic diagram of an example integrated circuit device for testing an input type system pad using a test pad, according to one or more implementations.

FIG. 2D is a schematic diagram of an example integrated circuit (IC) device 270 for testing an input type system pad 274 using a test pad 276, according to one or more implementations. The IC device 270 can be Die-A 110, Die-B 120, or Die-C 130 of FIG. 1. The IC device 270 includes an internal circuit (or internal integrated circuit) 272, a system pad 274, and a test pad 276. The system pad 274 can be the system pad 112, 122, or 132 of FIG. 1, and the test pad 276 can be the test pad 114, 124, or 134 of FIG. 1. The system pad 274 is an input type system pad configured to receive signals from an external integrated circuit device or die and transmit the signals to the internal circuit 272. The IC device 270 is configured for checking or testing the system pad 274 during wafer-level testing by using the test pad 276, for example, by providing an external signal from the test pad 276 through the system pad 274 to the internal circuit 272.

As illustrated in FIG. 2D, the system pad 274 is electrically connected to the internal circuit 272 via an in buffer 278. The in buffer 278 can be configured to convert a logic type for the system pad 274 to a logic type for the internal circuit 272. The test pad 274 is electrically coupled to the system 274 through an in buffer 280. The in buffer 280 can be also configured to convert a logic type for the test pad 276 into the logic type for the system pad 274.

During wafer-level testing, when a signal on the test pad 276, e.g., from an external source, is sent to the system pad 274 through the in buffer 280, and then the signal on the system pad 274 is sent to the internal circuit 272 through the in buffer 278. The signal received by the internal circuit 272 can be output to another test pad on the IC device 270 for measurement. A result of the measurement can be used to determine whether the signal on the system pad 274 is correct or whether the system pad 274 and/or a path from the system pad 274 to the internal circuit 272 works properly, e.g., whether a difference between the result of measurement and a reference result is within a predetermined threshold.

Figure 4:
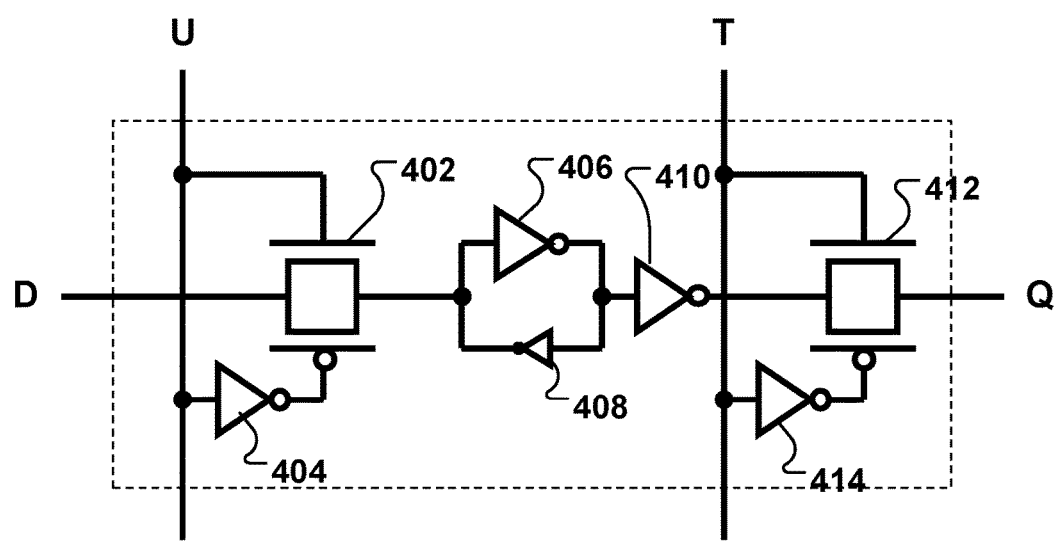
FIG. 4 shows a circuit diagram of an example controlled latch (LATZ) circuit, according to one or more implementations.

In some implementations, as illustrated in FIG. 2D, the IC device 270 includes a controlled latch (LATZ) circuit 282 arranged between the in buffer 280 and the system pad 274. FIG. 4 shows a circuit diagram of an example LATZ circuit 400, according to one or more implementations. The LATZ circuit 400 can be used as the LATZ circuit 282 of FIG. 2D. The LATZ circuit 400 includes a latch circuit, e.g., the latch circuit 300 of FIG. 3, and an additional switching component.

As illustrated in FIG. 4, the LATZ circuit 400 includes a first switching component having a switch 402 and an inverter 404, a latching component having a larger inverter 406 and a smaller inverter 408, an inverter 410, and a second switching component having a switch 412 and an inverter 414. The latch circuit 400 includes a first input U for receiving a first control signal, a second input T for receiving a second control signal (or a switching signal), a third input D for receiving an input signal, e.g., a signal on a system pad, and an output Q for outputting a signal latched in the latching component.

The first switching component of the LATZ circuit 400 can be similar to the switching component of the LAT circuit 300 of FIG. 3. The latching component of the LATZ circuit 400 can be similar to the latching component of the LAT circuit 300 of FIG. 3, and the smaller inverter 408 has a weaker drive capability than the larger inverter 406. The first control signal on the first input U can determine whether to update a signal stored in the latching component. When the first control signal on the first input U keeps high at "1", the latching component of the LATZ 400 updates the stored signal; when the first control signal turns from "1" to "0", the latching component keeps the signal. When the second control signal on the second input T is "0", the output Q is isolated from the downstream component, e.g., a system pad; when the second control signal on the second input T is set to "1", the second switching component is open, and the output Q delivers a signal stored in the latching component.

Referring back to FIG. 2D, during a normal operation, a signal is sent outside, e.g., from an external IC device, through the system pad 274 to the internal circuit 272. A control signal on input T of the LATZ 282 circuit can be set to "0" to isolate from the system pad 274, such that there is no power or energy consumption and interference from the test pad 276. During wafer level testing, the system pad 274 is disconnected from the external IC device. The control signal on the input T of the LATZ circuit 282 is set to "1" such that a signal is sent outside, e.g., from an external source, through the test pad 276 can be delivered to the system pad 274 for emulating an outside signal. When a control signal on input U keeps high at "1", the LATZ circuit 282 keeps updating the emulated signal on the system pad 274; when the control signal on the input U turns from "1" to "0" at a specific time point, the LATZ circuit 282 samples the emulated signal on the system pad 274 at the specific time point. The control signals on the inputs U and T of the LATZ circuit 282 can be provided and controlled by the internal circuit 272.

Figure 5A:
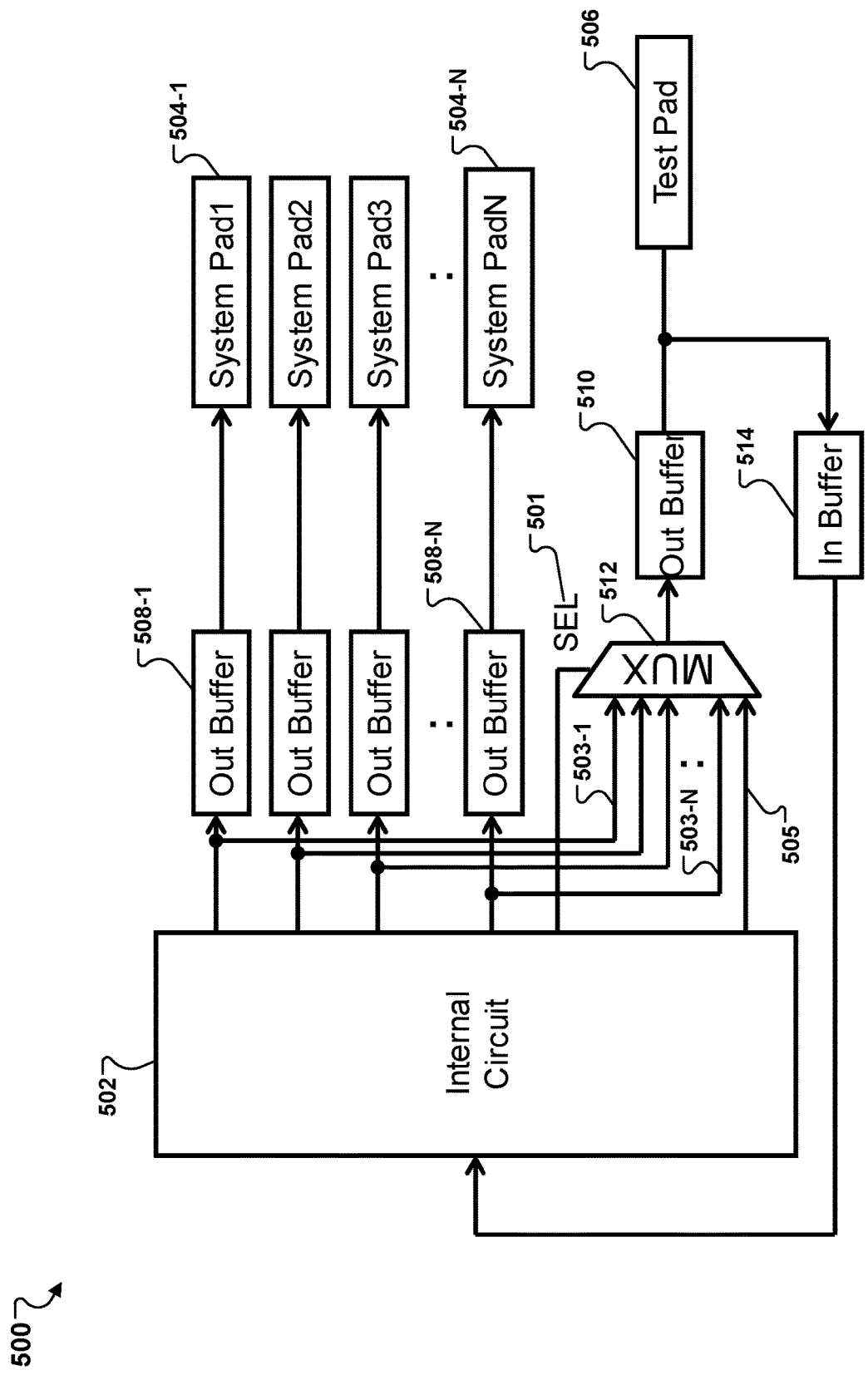
FIG. 5A is a schematic diagram of an example integrated circuit device for testing multiple output type system pads using a test pad, according to one or more implementations.
Figure 5B:
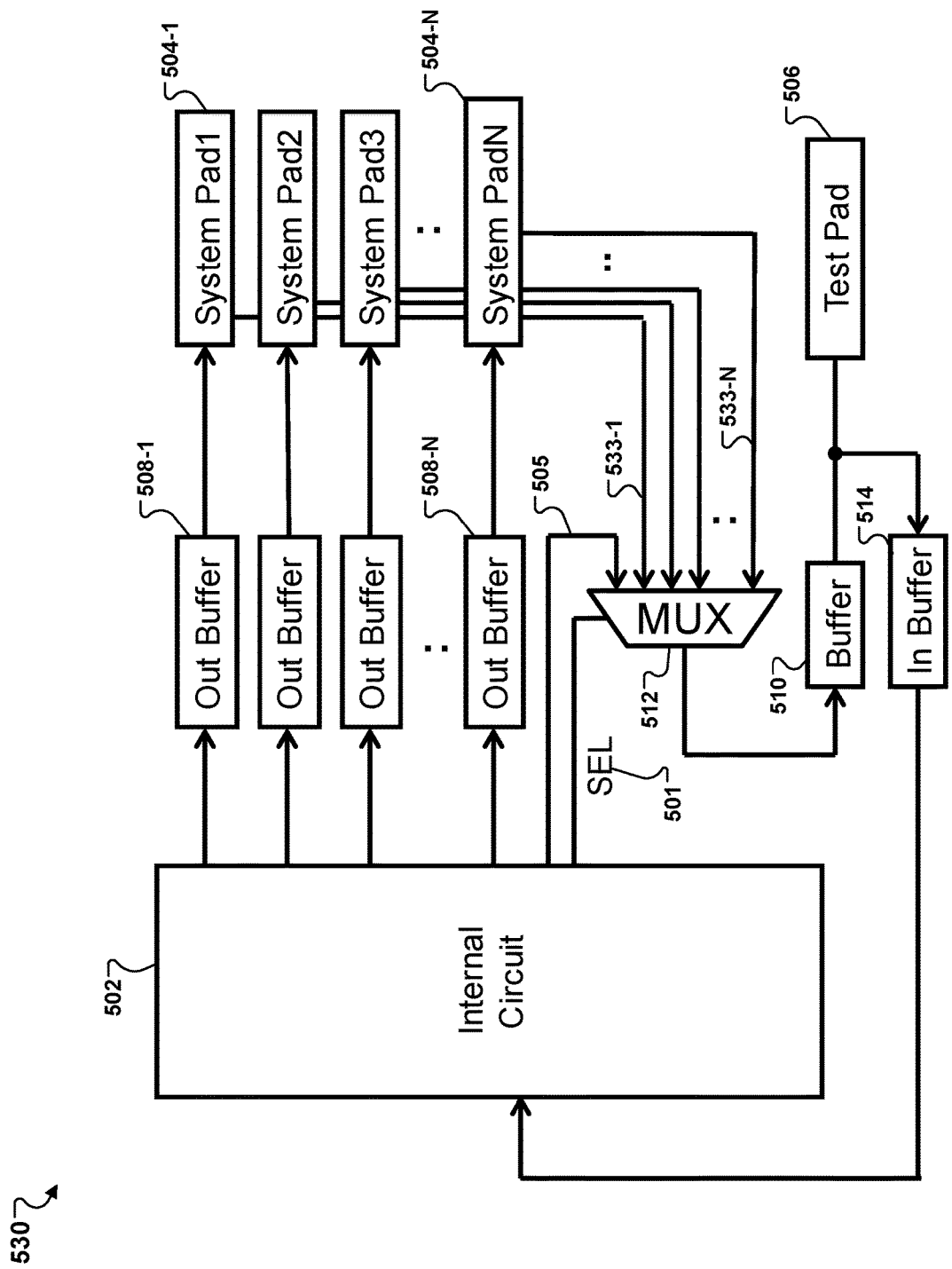
FIG. 5B is a schematic diagram of another example integrated circuit device for testing multiple output type system pads using a test pad, according to one or more implementations.
Figure 5C:
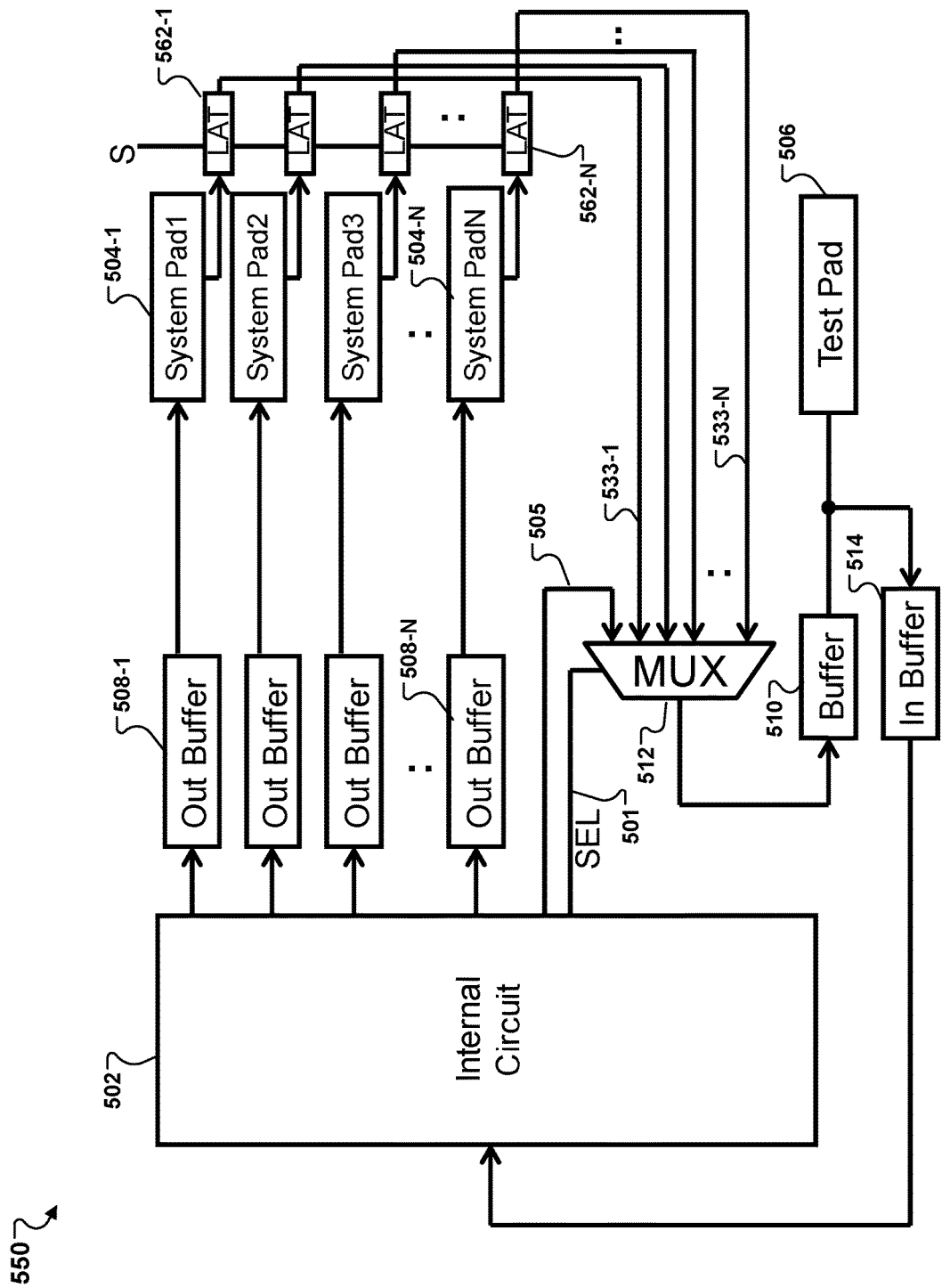
FIG. 5C is a schematic diagram of a further example integrated circuit device for testing signals on multiple output type system pads at a specific time spot using a test pad, according to one or more implementations.

In an integrated circuit (IC) device, a test pad can be electrically connected to a number of system pads and used for testing signals on each of the system pads, e.g., by multiplexing or latching technologies. The system pads can be output type system pads, input type system pads, or a combination of output type system pads and input type system pads. FIGS. 5A-5C show different examples of IC devices for testing multiple output type system pads using a test pad. For illustration purposes only, same labels are used for same components in FIGS. 5A-5C FIG. 6A shows an example IC device for testing multiple input type system pads using a test pad, and FIGS. 6B-6C show example IC devices for testing multiple output type system pads and multiple input type system pads using a test pad. For illustration purposes only, same labels are used for same components in FIGS. 6A-6C.

FIG. 5A is a schematic diagram of an example integrated circuit (IC) device 500 for testing multiple output type system pads 504-1, . . . , 504-N (referred to generally as output type system pads 504 and individually as output type system pad 504) using a test pad 506, according to one or more implementations. The IC device 500 corresponds to the IC device 200 of FIG. 2A but with multiplexing capability.

The IC device 500 includes an internal integrated circuit (or internal circuit) 502 that is electrically connected to each of the system pads 504 via a respective out buffer 508-1, . . . , 508-N (referred to generally as out buffers 508 or individually as out buffer 508). The internal circuit 502 can be similar to the internal circuit 202 of FIG. 2A, 232 of FIG. 2B, or 252 of FIG. 2C. The output type system pad 504 can be the system pad 204 of FIG. 2A, 234 of FIG. 2B, or 254 of FIG. 2C. The out buffer 508 can be the out buffer 208 of FIG. 2A, 238 of FIG. 2B, or 258 of FIG. 2C. The test pad 506 can be the test pad 206 of FIG. 2A, 236 of FIG. 2B, or 256 of FIG. 2C.

The IC device 500 includes a multiplexer (MUX) 512 electrically connected to an electrical contact between the internal circuit 502 and each of the out buffers 508, such that a signal that is sent from the internal circuit 502 to any one of the output type system pads 504 can be also sent to the multiplexer 512 through a corresponding electrical connection, e.g., an electrical wire, 503-1, . . . , 503N (referred to generally as electrical connections 503 and individually as electrical connection 503). The internal circuit 502 is configured to send a selection signal to the multiplexer 512 through a selection (SEL) line 501. The multiplexer 512 is electrically connected to the test pad 506 through an out buffer 510. The multiplexer 512 is controlled by the selection signal to select one of signals on the electrical connections 503 to output to the test pad 506. The internal circuit 502 is configured to control the selection signal.

During wafer-level testing, the multiplexer 512 can be configured to sequentially select the system pads 504 for testing by controlling the selection signal to the multiplexer 512 to select the corresponding electrical connections 503. The selected system pad 504 can be tested by using the test pad 506 in a similar way as described in FIG. 2A. For example, a testing signal that is sent from the internal circuit 502 to the selected system pad 504 through a corresponding out buffer 508 can be also sent to the test pad 506 through a corresponding electrical connection 503, the multiplexer 512, and the out buffer 510.

In some implementations, the internal circuit 502 is electrically connected to the multiplexer 512 with an additional signal line 505. The multiplexer 512 can be controlled by the selection signal to select a signal from the internal circuit 502 through the signal line 505 to output to the test pad 506. Signals on the test pad 506, e.g., from an external device, can be sent to the internal circuit 502 through an in buffer 514. For example, during wafer-level testing, a signal for detection of the internal circuit 502 can be provided to the test pad 506 and delivered to the internal circuit 502 through the in buffer 514. The internal circuit 502 can also output an output signal through the electrical connection 505 to the test pad 506 by selecting the electrical connection 505 by the multiplexer 512.

FIG. 5B is a schematic diagram of another example integrated circuit device 530 for testing multiple output type system pads 504 using a test pad 506, according to one or more implementations. The IC device 530 corresponds to the IC device 230 of FIG. 2B but with multiplexing capability.

Different from the IC device 500 of FIG. 5A where each of the electrical connections 503 is electrically connected to an electrical contact between the internal circuit 502 and a corresponding out buffer 508, in the IC device 530, each of the system pads 504 is electrically connected to a multiplexer 512 using a corresponding electrical connection 533-1, ... 533-N (referred to generally as electrical connections 533 and individually as electrical connection 533). The multiplexer 512 is configured to select one of the electrical connections 533 based on a selection signal from the internal circuit 502. In such a way, during wafer-level testing, each of the system pads 504 can be selected for testing by the multiplexer 512 selecting to connect the corresponding electrical connection 533 to the test pad 506 through a buffer 510.

FIG. 5C is a schematic diagram of a further example integrated circuit device 550 for testing signals on multiple output type system pads 504 at a specific time spot using a test pad 506, according to one or more implementations. The IC device 550 corresponds to the IC device 250 of FIG. 2C but with multiplexing capability.

Different from the IC device 530 of FIG. 5B, the IC device 550 includes a number of latch (LAT) circuits 562-1, ..., 562-N (referred to generally as latch circuits 562 and individually as latch circuit 562). The latch circuit 562 can be the latch circuit 262 of FIG. 2C or 300 of FIG. 3. Each of the latch circuits 562 is arranged downstream a respective system pad 504 and upstream to the multiplexer 512 through a corresponding electrical connection 533. The latch circuits 562 can be controlled by a same control signal provided on inputs (S) of the latch circuits 562, in such way, signals on the system pads 504 from the internal circuit 502 can be sampled instantaneously at a specific time point when the control signal goes low to "0". That is, the signals on the system pads 504 at the specific time point are sampled and latched in the latch circuits 562. The control signal can be controlled by the internal circuit 502.

After latching, the control signal can be kept low to keep the sampled signals latched in the latch circuits 562, which can then be checked on the test pad 506 with a slower speed. The latched sampled signals can be sequentially send to the test pad 506 for testing by the multiplexer 512 selecting or switching the latch circuits based on a selection signal. After all the latched signals are checked by probing the test pad 506, the control signal input to the latch circuits 562 could go high again to receive signals on the system pads 504 and select another specific time point to go low to sample the signals on the system pads 504 at the another specific time point.

Figure 6A:
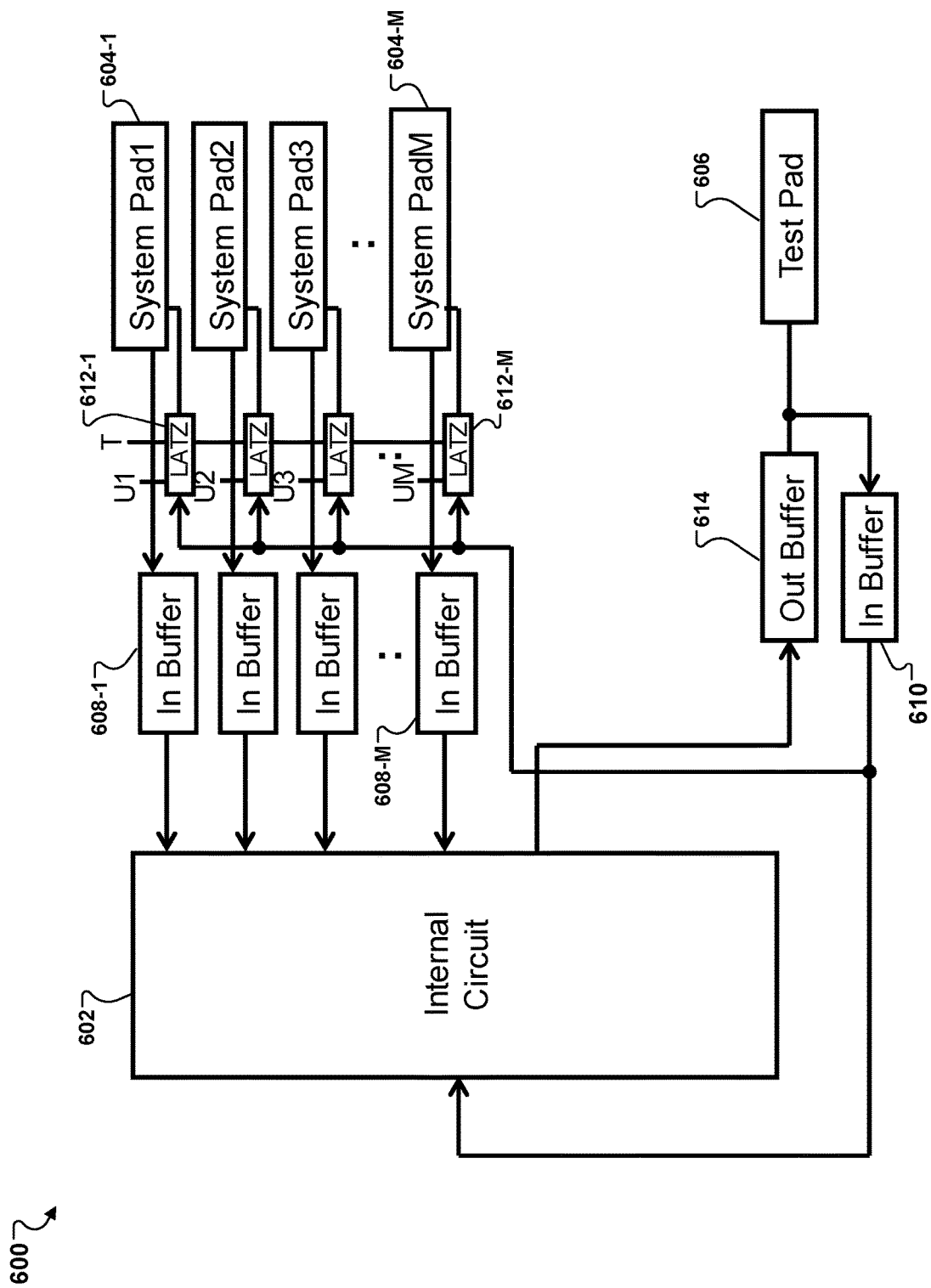
FIG. 6A is a schematic diagram of an example integrated circuit device for testing multiple input type system pads using a test pad, according to one or more implementations.
Figure 6B:
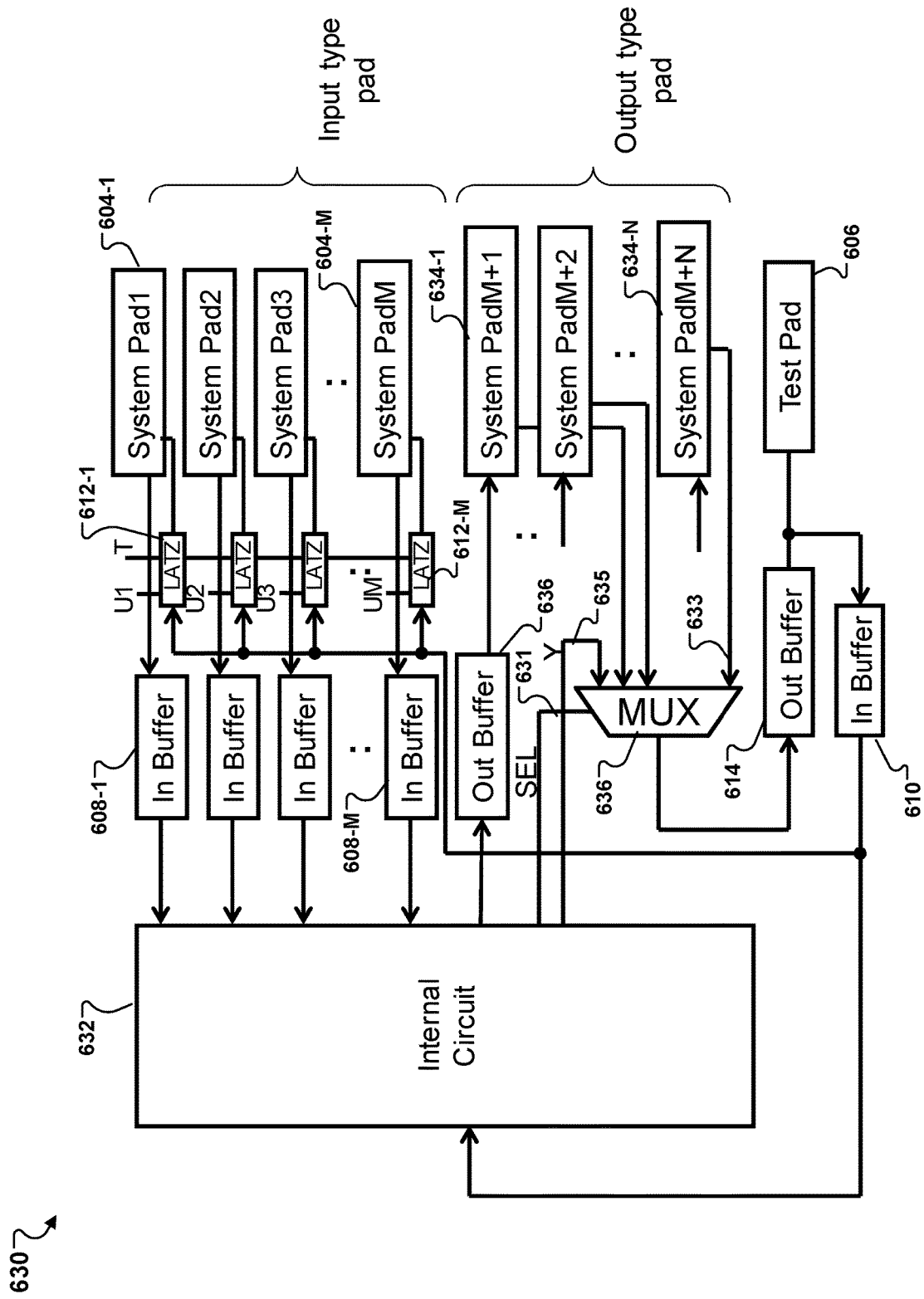
FIG. 6B is a schematic diagram of an example integrated circuit device for testing multiple input type system pads and multiple output type system pads using a test pad, according to one or more implementations.
Figure 6C:
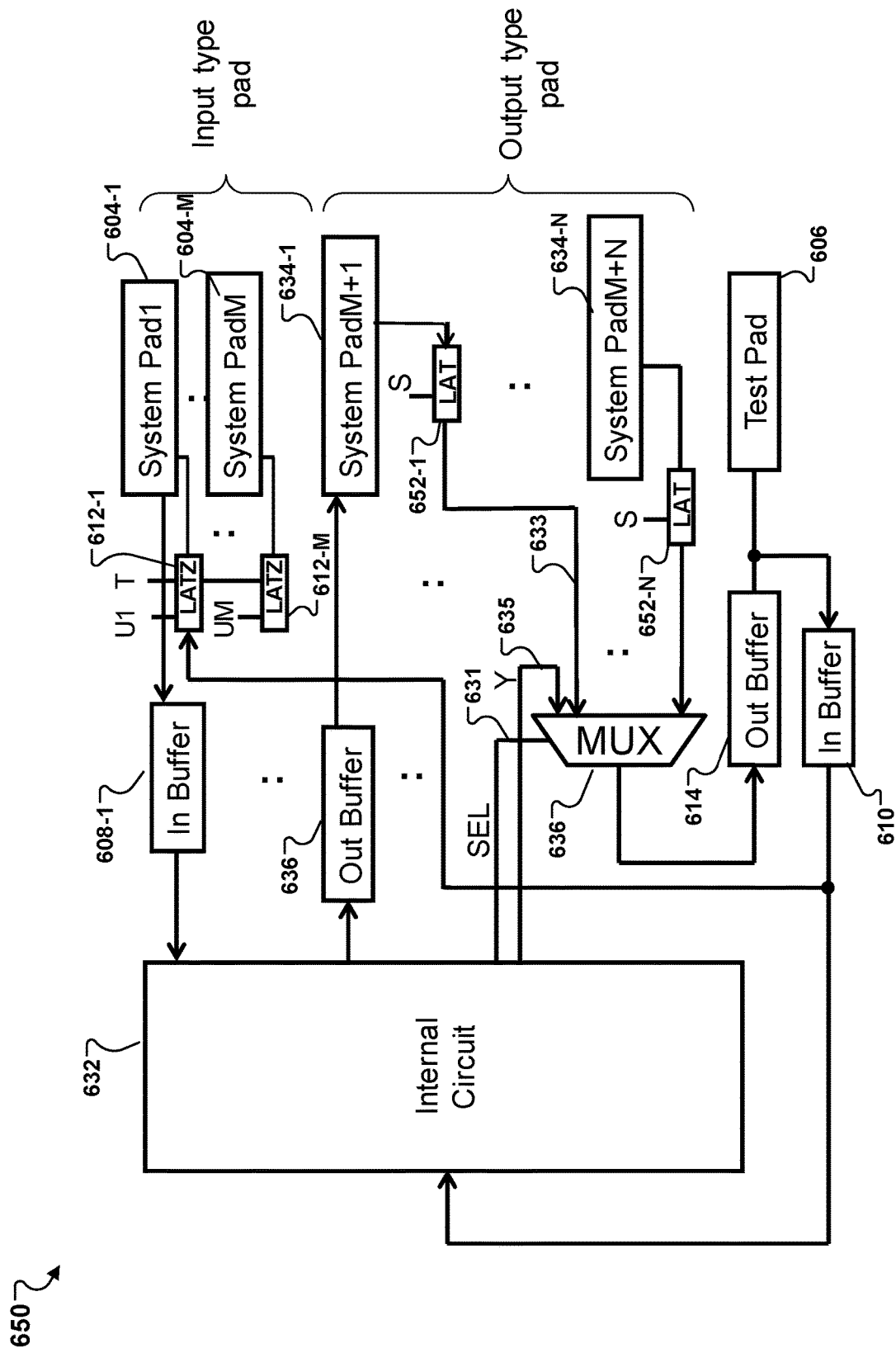
FIG. 6C is a schematic diagram of another example integrated circuit device for testing multiple input type system pads and multiple output type system pads using a test pad, according to one or more implementations.

FIG. 6A is a schematic diagram of an example integrated circuit device 600 for testing multiple input type system pads 604-1, ..., 604-M (referred to generally as input type system pads 604 and individually as input type system pad 604) using a test pad 606, according to one or more implementations. The IC device 600 corresponds to the IC device 270 of FIG. 2D but with multiplexing capability.

The IC device 600 includes an internal integrated circuit (or internal circuit) 602 that is electrically connected to each of the system pads 604 via a respective in buffer 608-1, ..., 608-M (referred to generally as in buffers 608 or individually as in buffer 608). The internal circuit 602 can be similar to the internal circuit 272 of FIG. 2D. The input type system pad 604 can be the system pad 274 of FIG. 2D. The in buffer 608 can be the the in buffer 278 of FIG. 2D.

The test pad 606 can correspond to the test pad 276 of FIG. 2D. Different from the test pad 276 that is electrically connected to one system pad 274 through one LATZ circuit 282 in FIG. 2D, the test pad 606 is electrically connected to the multiple system pads 604 each through an in buffer 610 and a respective LATZ circuit 612-1, ..., 612-M (referred to generally as LATZ circuits 612 or individually as LATZ circuit 612). The LATZ circuit 612 can be the LATZ circuit 282 of FIG. 2D or the LATZ circuit 400 of FIG. 4. Each LATZ circuit 612 has an U input (U1, ..., UM) for receiving a first control signal and a T input for receiving a second control signal. The T inputs of the LATZ circuits 612 are configured to connect together to receive a same second control signal. The U inputs of the LATZ circuits 612-1, ..., 612-M are configured to receive a respective first control signal, such that the system pads 604 can be individually selected to receive a testing signal from the test pad 606. The respective first control signals to the U inputs and the second control signal to the T inputs of the LATZ circuits 612 can be controlled by the internal circuit 602.

During a normal operation, signals are sent outside, e.g., from one or more external IC devices, through the system pads 604 to the internal circuit 602. A control signal on inputs T of the LATZ circuits 612 can be set to "0" to isolate the test pad 606 (and the LATZ circuits 612 and the in buffer 610) from the system pads 604, such that there is no power or energy consumption and interference from the test pad 606. During wafer level testing, the system pads 604 are disconnected from the external IC devices. The control signal on the input T of the LATZ circuit 612 is set to "1" such that a signal is sent outside, e.g., from an external source, through the test pad 606 can be delivered to the system pad 604 for emulating an outside signal. When a control signal on input U of a LATZ circuit 612 keeps high at "1", the LATZ circuit 612 keeps updating the emulated signal on a corresponding system pad 604; when the control signal on the input U turns from "1" to "0" at a specific time point, the LATZ circuit 612 samples the emulated signal on the corresponding system pad 604 at the specific time point. The internal circuit 602 can set one of the control signals on the input U of the LATZ circuit 612 to "1" each time to update the signal to be sent to the corresponding system pad 604 for testing.

In some implementations, the IC device 600 includes an output buffer 614 coupled between an output of the internal circuit 602 and the test pad 606. Signals on the test pad 606, e.g., from an external device, can be sent to the internal circuit 602 through the in buffer 610. The internal circuit 602 can also output an output signal through the output buffer 614 to the test pad 606. For example, during wafer-level testing, a signal for detection of the internal circuit 602 can be provided to the test pad 606 and delivered to the internal circuit 602 through the in buffer 610, and the internal circuit 602 outputs an output signal based on the received signal to the test pad 606 through the out buffer 614. The output signal can be then probed or measured at the test pad 606.

FIG. 6B is a schematic diagram for an example integrated circuit (IC) device 630 for testing multiple input type system pads 604 and multiple output type system pads 634-1, . . . , 634-N (referred to generally as output type system pads 634 and individually as output type system pad 634) using a same test pad 606, according to one or more implementations. The multiple input type system pads 604 can be tested by an IC device configuration same as the IC device 600 of FIG. 6A, while the multiple output type system pads 634 can be tested by an IC device configuration corresponding to the IC device 530 of FIG. 5B.

The IC device 630 includes an internal circuit 632 electrically connected to each of the input type system pads 604 through a respective in buffer 608 and to each of the output type system pads 634 through a respective out buffer 636. The internal circuit 632 is configured to control the testing of the input type system pads 604 and the output type system pads 634. Each output type system pad 634 is coupled to a multiplexer 636 through a respective electrical connection 633. The multiplexer 636 is configured to receive a selection signal from the internal circuit 632 through a selection line 631 and to select one of the output type system pads 634 for testing based on the selection signal. The multiplexer 636 is also configured to receive a specific signal from the internal circuit 632 through an electrical line Y 635. The specific signal can be a signal sampling from an internal signal of an internal logic block to check a correctness of the internal signal, or a signal to indicate other test status (like test is progressing, test passed/failed) of the internal circuit 632. The specific signal can be selected by the multiplexer 636 to be sent to the test pad 606.

FIG. 6C is a schematic diagram for another example integrated circuit (IC) device 650 for testing multiple input type system pads 604 and multiple output type system pads 634 using a same test pad 606, according to one or more implementations. The multiple input type system pads 604 can be tested by an IC device configuration same as the IC device 600 of FIG. 6A, while the multiple output type system pads 634 can be tested by an IC device configuration corresponding to the IC device 550 of FIG. 5C.

Compared to the IC device 630 of FIG. 6B, the IC device 650 additionally includes a number of latch (LAT) circuits 652-1, . . . , 652-N (referred to generally as latch circuits 652 and individually as latch circuit 652). The latch circuit 652 can be the latch circuit 262 of FIG. 2C, 300 of FIG. 3, 562 of FIG. 5C. Each of the latch circuits 652 is arranged between a respective system pad 634 and the multiplexer 636 through a corresponding electrical connection 633. The latch circuits 652 can be controlled by a same control signal provided on inputs (S) of the latch circuits 652, in such a way, signals on the system pads 634 from the internal circuit 632 can be sampled instantaneously at a specific time point when the control signal goes low to "0". That is, the signals on the system pads 634 at the specific time point are sampled and latched in the latch circuits 652. The control signal can be controlled by the internal circuit 632. After latching, the control signal can be kept low to keep the sampled signals latched in the latch circuits 652, which can then be checked on the test pad 606 with a slower speed. The latched sampled signals can be sequentially send to the test pad 606 for testing by the multiplexer 636 selecting or switching the latch circuits based on a selection signal. After all the latched signals are checked by probing the test pad 606, the control signal input to the latch circuits 652 could go high again to receive signals on the system pads 634 and select another specific time point to go low to sample the signals on the system pads 634 at the another specific time point.

Figure 7A:
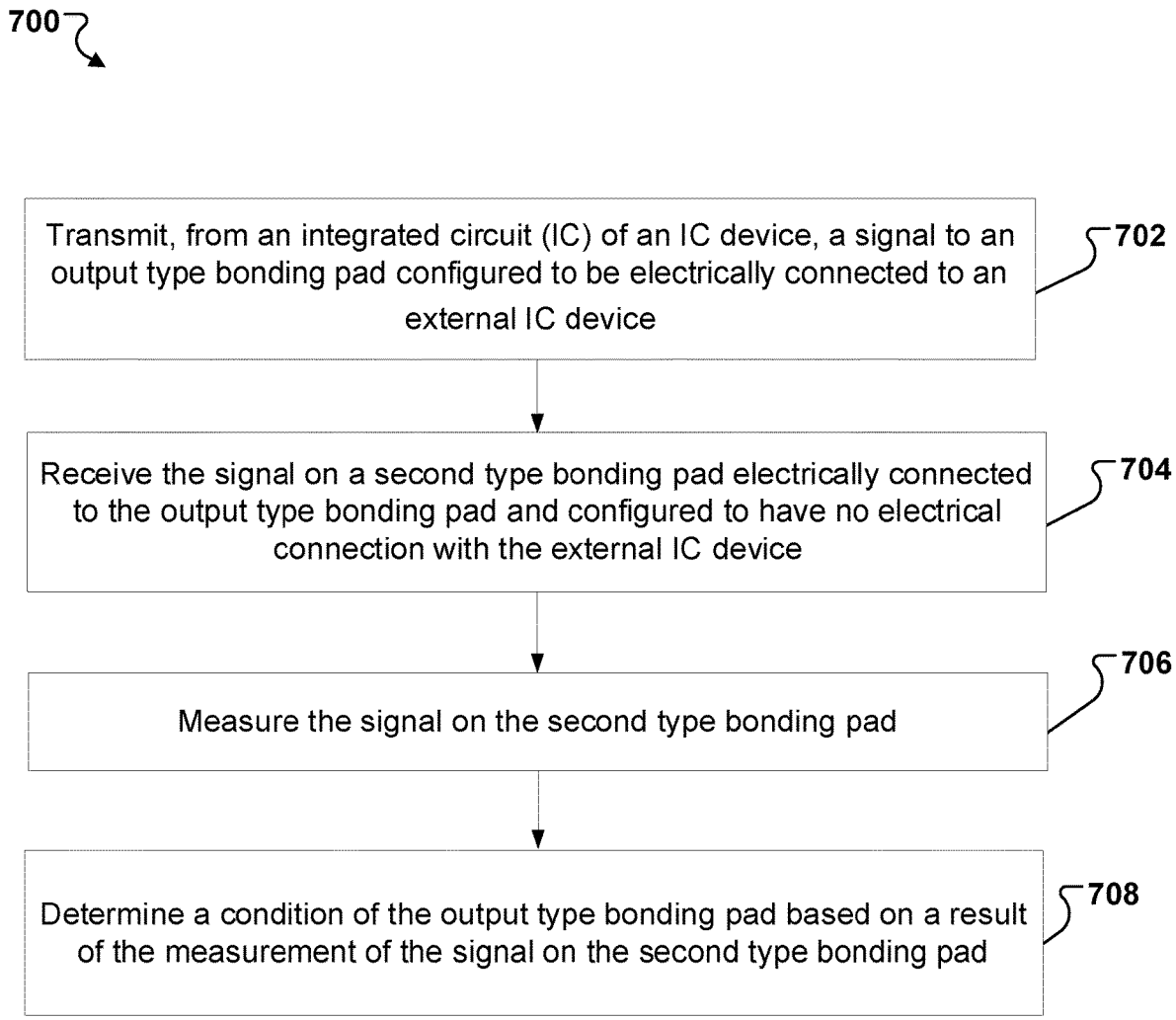
FIG. 7A illustrates a flow chart of an example process for testing output type bonding pads in an integrated circuit device, according to one or more implementations.

FIG. 7A illustrates a flow chart of an example process 700 for testing output type bonding pads in an integrated circuit (IC) device, according to one or more implementations. The IC device can be Die-A 110, Die-B 120, or Die-C 130 of FIG. 1, the IC device 200 of FIG. 2A, 230 of FIG. 2B, or 250 of FIG. 2C, the IC device 500 of FIG. 5A, 530 of FIG. 5B, or 550 of FIG. 5C, or the IC device 630 of FIG. 6B or 650 of FIG. 6C. The output type bonding pad can be the system pad 112, 122, or 132 of FIG. 1, 204 of FIG. 2A, 234 of FIG. 2B, or 254 of FIG. 2C, 504 of FIG. 5A-5C, or 634 of FIGS. 6B-6C. The IC device includes at least one second type bonding pad, e.g., the test pad 114, 124, or 134 of FIG. 1, the test pad 206 of FIG. 2A, 236 of FIG. 2B, 256 of FIG. 2C, the test pad 506 of FIGS. 5A-5C, or the test pad 606 of FIGS. 6B-6C. The IC device includes an internal integrated circuit, e.g., the internal circuit 202 of FIG. 2A, 232 of FIG. 2B, or 252 of FIG. 2C, the internal circuit 502 of FIGS. 5A-5C, or the internal circuit 632 of FIGS. 6B-6C. The process 700 can be performed by the IC device during a wafer-level testing, e.g., before integrating or packaging the IC device with one or more other IC devices to form a chiplet system, e.g., the system 100 of FIG. 1.

A signal is transmitted from the internal circuit to an output type bonding pad (702), and the signal is received on the second type bonding pad electrically connected to the output type bonding pad (704). The output type bonding pad is configured to be electrically connected to an external IC device and configured to transmit internal data from the IC device to the external IC device. The second type bonding pad is configured to have no electrical connection with the external IC device. The second type bonding pad has a larger pad area than the output type bonding pad.

In some implementations, the IC device includes a plurality of output type bonding pads. The integrated circuit is electrically connected to each of the output type bonding pads via a respective buffer. The IC device can include a multiplexer, e.g., the multiplexer 512 of FIGS. 5A-5C, or the multiplexer 636 of FIGS. 6B-6C. The multiplexer is configured to select one of the output type bonding pads based on a selection signal such that the selected output type bonding pad is electrically connected to the second type bonding pad. The integrated circuit can be configured to provide the selection signal to the multiplexer.

In some implementations, the multiplexer is electrically connected to corresponding electrical contacts between the integrated circuit and the respective buffers. In some implementations, each of the output type bonding pads is electrically connected to the multiplexer via a respective electrical connection, and the second type bonding pad is electrically connected to the multiplexer via a second buffer that is different from the respective buffers for the output type bonding pads. In some examples, the IC device further includes a plurality of latch circuits, e.g., the LAT circuit 262 of FIG. 2C, 300 of FIG. 3, 562 of FIG. 5C, or 652 of FIG. 6C. Each of the output type bonding pads can be electrically connected to the multiplexer via a respective latch circuit. The plurality of latch circuits can be configured to receive a control signal and configured to simultaneously latch signals on the plurality of first type bonding pads when the control signal is at a first state and separately update the signals on the plurality of first type bonding pads when the control signal is at a second state different from the first state. The multiplexer can be configured to: when the control signal remains at the first state, sequentially select the first type bonding pads to be electrically connected with the second type bonding pad such that the simultaneously latched signals in the plurality of latch circuits are sequentially provided to the second type bonding pad.

The signal on the second type bonding pad is measured (706). For example, an external measurement device such as a current or voltage meter can probe the second type bonding pad and obtain a measurement result of the signal on the second type bonding pad.

A condition of the output type bonding pad is determined based on the measurement result of the signal on the second type bonding pad (708). As the signal on the second type bonding pad corresponds to the signal on the output type bonding pad, the condition of the output type bonding pad, and/or the condition of a circuit path from the internal circuit to the output type bonding pad and to the second type bonding pad can be determined, e.g., to see whether it functions properly.

Figure 7B:
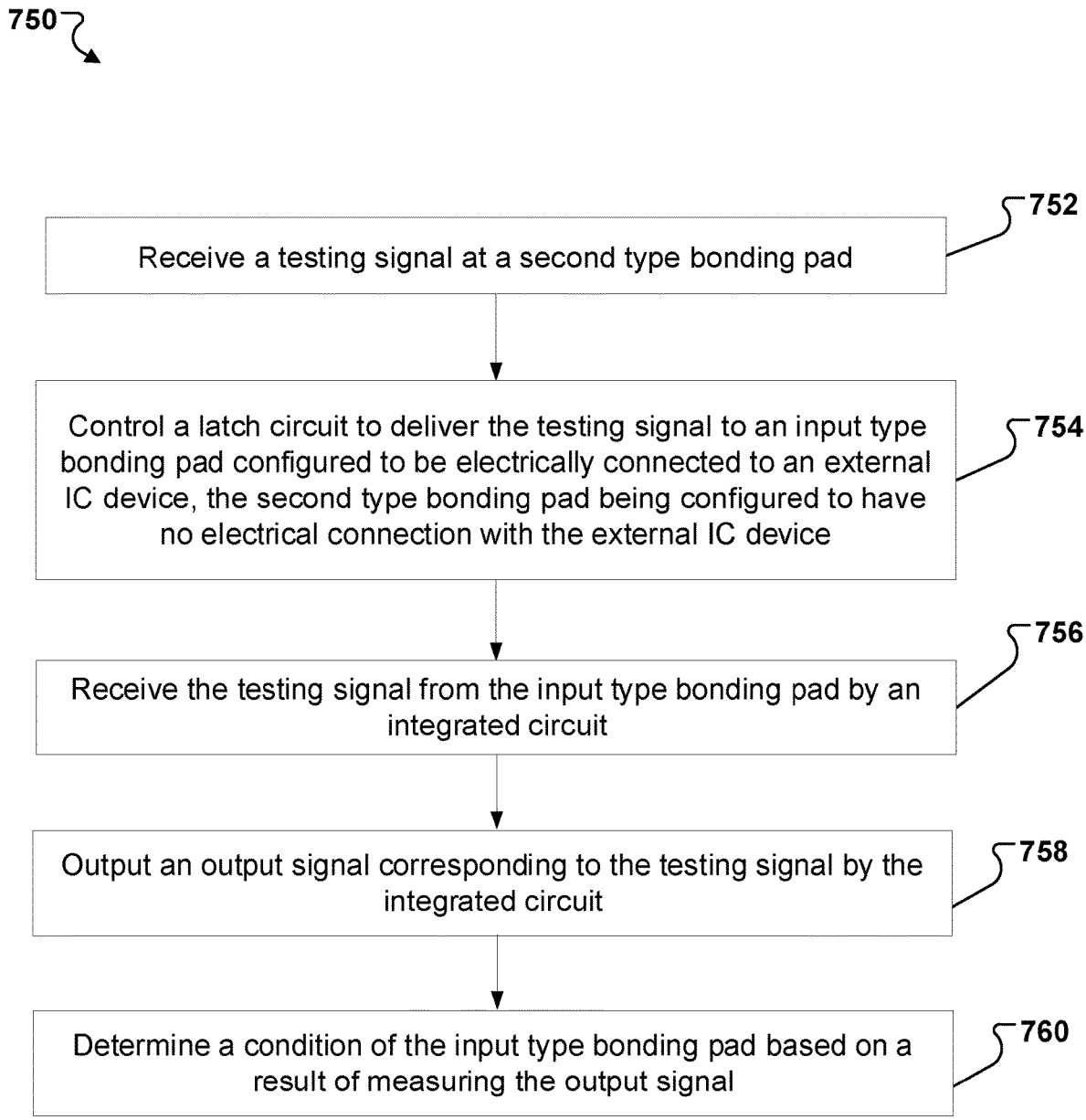
FIG. 7B illustrates a flow chart of an example process for testing input type bonding pads in an integrated circuit device, according to one or more implementations.

FIG. 7B illustrates a flow chart of an example process 750 for testing input type bonding pads in an integrated circuit (IC) device, according to one or more implementations. The IC device can be Die-A 110, Die-B 120, or Die-C 130 of FIG. 1, the IC device 270 of FIG. 2D, or the IC device 600 of FIG. 6A, 630 of FIG. 6B or 650 of FIG. 6C. The input type bonding pad can be the system pad 112, 122, or 132 of FIG. 1, 274 of FIG. 2D, or 604 of FIGS. 6A-6C. The IC device includes at least one second type bonding pad, e.g., the test pad 114, 124, or 134 of FIG. 1, the test pad 276 of FIG. 2D, or the test pad 606 of FIGS. 6A-6C. The IC device includes an internal integrated circuit, e.g., the internal circuit 272 of FIG. 2D, the internal circuit 602 of FIG. 6A or 632 of FIGS. 6B-6C. The process 750 can be performed by the IC device during a wafer-level testing, e.g., before integrating or packaging the IC device with one or more other IC devices to form a chiplet system, e.g., the system 100 of FIG. 1.

A testing signal is received at the second type bonding pad (752). An external signal source can provide the testing signal to the second type bonding pad. Each of the input type bonding pads is configured to be electrically connected to a corresponding external IC device and receive external data from the corresponding IC device to the integrated circuit. The second type bonding pad is configured to have no electrical connection to the corresponding external IC device. The second type bonding pad has a larger pad area than the input type bonding pad.

A latch circuit is controlled to deliver the testing signal from the second type bonding pad to an input type bonding pad (754). The latch circuit can be the LATZ circuit 282 of FIG. 2D, 400 of FIG. 4, or 612 of FIGS. 6A-6C.

In some implementations, the IC device includes a plurality of latch circuits including the latch circuit. Each of the input type bonding pads is configured to be electrically connected to the second type bonding pad via a respective latch circuit of the plurality of latch circuits. Each of the plurality of latch circuits is configured to receive a switching signal and configured to: electrically isolate the second type bonding pad from a corresponding input type bonding pad electrically connected with the latch circuit when the switching signal is an off signal, and electrically connect the second type bonding pad to the corresponding input type bonding pad with the latch circuit when the switching signal. Each of the plurality of latch circuits can be configured to receive a respective control signal and configured to: update a signal from the second type bonding pad to the corresponding input type bonding pad when the switching signal is the on signal and the respective control signal is at a first state, and latch the signal from the second type bonding pad to the corresponding input type bonding pad when the switching signal is the on signal and the respective control signal is at a second state different from the first state. The integrated circuit can be configured to provide the switching signal and the respective control signals to the plurality of latch circuits.

The testing signal from the input type bonding pad is received by the integrated circuit (756). Each of the input type bonding pads can be electrically connected to the integrated circuit via a respective in buffer. The in buffer can be the in buffer 280 of FIG. 2D or 608 of FIGS. 6A-6C.

The integrated circuit can output an output signal corresponding to the testing signal from the input type bonding pad (758). For example, the integrated circuit is electrically connected to another second type bonding pad via an out buffer. The another second type bonding pad can be the test pad 114, 124, or 134 of FIG. 1, the test pad 206 of FIG. 2A, 236 of FIG. 2B, 256 of FIG. 2C, the test pad 506 of FIGS. 5A-5C, or the test pad 606 of FIGS. 6B-6C. The out buffer can be the buffer 210 of FIG. 2A, 240 of FIG. 2B, 260 of FIG. 2C, or 510 of FIG. 5A-5C, or 614 of FIGS. 6A-6C. The another second type bonding pad can be probed by an external measurement device and the output signal can be measured.

A condition of the input type bonding pad is determined based on a result of measuring the output signal on the another second type bonding pad (760). As the output signal on the another second type bonding pad corresponds to the testing signal through the input type bonding pad, the condition of the input type bonding pad, and/or the condition of a circuit path from the second type bonding pad to the input type bonding pad, then to the internal circuit can be determined, e.g., to see whether it functions properly.

In some implementations, the IC device includes a plurality of output type bonding pads each configured to transmit internal data from the integrated circuit to the corresponding external integrated circuit device and a plurality of input type bonding pads each configured to receive external data from the corresponding external integrated circuit device. Each of the output type bonding pads can be tested by using the process 700 of FIG. 7A. Each of the input type bonding pads can be tested by using the process 750 of FIG. 7B.

The IC device can further include a multiplexer electrically connected to each of the output type bonding pads via a corresponding electrical connection and to the second type bonding pad via a buffer and configured to select one of the output type bonding pads based on a selection signal such that the selected one of the output type bonding pads is electrically connected to the second type bonding pad.

The IC device can further include a plurality of latch circuits, e.g., the LATZ circuits. Each of the input type bonding pads is configured to be electrically connected to the second type bonding pad via a respective latch circuit of the plurality of latch circuits. Each of the plurality of latch circuits is configured to: receive a respective control signal and a respective switching signal, electrically isolate the second type bonding pad from a corresponding input type bonding pad electrically connected with the latch circuit when the respective switching signal is an off signal, and electrically connect the second type bonding pad with the corresponding input type bonding pad with the latch circuit when the respective switching signal is an on signal, such that a signal from the second type bonding pad to the corresponding input type bonding pad is updated when the respective control signal is at a first state and the signal from the second type bonding pad to the input type bonding pad is latched when the respective control signal is at a second state different from the first state.

The IC device can further include a plurality of second latch circuits, e.g., the LAT circuits, each of the output type bonding pads being electrically connected to the multiplexer via a respective second latch circuit of the plurality of second latch circuits. The plurality of second latch circuits are configured to receive a second control signal and configured to: simultaneously latch signals on the plurality of first type bonding pads when the second control signal is at the first state and separately update the signals on the plurality of first type bonding pads when the second control signal is at the second state.

The integrated circuit can be configured to: provide the selection signal to the multiplexer, provide the respective switching signals and the respective control signals to the plurality of latch circuits, and provide the second control signal to the plurality of second latch circuits.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An integrated circuit device comprising:
an integrated circuit;
a plurality of first type bonding pads electrically connected to the integrated circuit, each of the first type bonding pads being configured to be electrically connected to a corresponding external integrated circuit device; and
a second type bonding pad configured to have no electrical connection with the corresponding external integrated circuit device, each of the first type bonding pads being configured to be electrically connected to the second type bonding pad, wherein the integrated circuit device is configured to perform at least one of:
i) sending a first signal along a first signal path from the integrated circuit through a first one of the first type bonding pads to the second type bonding pad to test the first one of the first type bonding pads, wherein the integrated circuit, the first one of the first type bonding pads, and the second type bonding pad are electrically connected in series along the first signal path, or
ii) receiving a second signal along a second signal path from the second type bonding pad through a second one of the first type bonding pads to the integrated circuit to test the second one of the first type bonding pads, wherein the second type bonding pad, the second one of the first type bonding pads, and the integrated circuit are electrically connected in series along the second signal path.

2. The integrated circuit device of claim 1, wherein a pad area of the second type bonding pad is larger than a pad area of each of the first type bonding pads.

3. The integrated circuit device of claim 1, wherein the integrated circuit is electrically connected to each of the first type bonding pads via a respective buffer.

4. The integrated circuit device of claim 3, further comprising a multiplexer configured to select one of the first type bonding pads based on a selection signal such that the selected one of the first type bonding pads is electrically connected to the second type bonding pad.

5. The integrated circuit device of claim 4, wherein the multiplexer is electrically connected to corresponding electrical contacts between the integrated circuit and the respective buffers.

6. The integrated circuit device of claim 4, wherein each of the first type bonding pads is electrically connected to the multiplexer via a respective electrical connection, and
wherein the second type bonding pad is electrically connected to the multiplexer via a second buffer that is different from the respective buffers for the first type bonding pads.

7. The integrated circuit device of claim 6, further comprising a plurality of latch circuits,
wherein each of the first type bonding pads is electrically connected to the multiplexer via a respective latch circuit of the plurality of latch circuits,
wherein the plurality of latch circuits are configured to receive a control signal and configured to:
simultaneously latch signals on the plurality of first type bonding pads when the control signal is at a first state and
separately update the signals on the plurality of first type bonding pads when the control signal is at a second state different from the first state.

8. The integrated circuit device of claim 7, wherein the multiplexer is configured to:
when the control signal remains at the first state, sequentially select the first type bonding pads to be electrically connected with the second type bonding pad such that the simultaneously latched signals in the plurality of latch circuits are sequentially provided to the second type bonding pad.

9. The integrated circuit device of claim 1, further comprising a plurality of latch circuits,
wherein each of the first type bonding pads is configured to be electrically connected to the second type bonding pad via a respective latch circuit of the plurality of latch circuits.

10. The integrated circuit device of claim 9, wherein each of the plurality of latch circuits is configured to receive a switching signal and configured to:
electrically isolate the second type bonding pad from a corresponding first type bonding pad electrically connected with the latch circuit when the switching signal is an off signal, and
electrically connect the second type bonding pad to the corresponding first type bonding pad with the latch circuit when the switching signal is an on signal.

11. The integrated circuit device of claim 10, wherein each of the plurality of latch circuits is configured to receive a respective control signal and configured to:
update a signal from the second type bonding pad to the corresponding first type bonding pad when the switching signal is the on signal and the respective control signal is at a first state, and
latching the signal from the second type bonding pad to the corresponding first type bonding pad when the switching signal is the on signal and the respective control signal is at a second state different from the first state.

12. The integrated circuit device of claim 1, wherein the integrated circuit comprises:
an input configured to be electrically connected to the second type bonding pad via a first buffer, and
an output configured to be electrically connected to the second type bonding pad via a second buffer different from the first buffer.

13. The integrated circuit device of claim 1, wherein the first type bonding pads comprise:
a plurality of output type bonding pads each configured to transmit internal data from the integrated circuit to the corresponding external integrated circuit device; and
a plurality of input type bonding pads each configured to receive external data from the corresponding external integrated circuit device.

14. The integrated circuit device of claim 13, further comprising:
a multiplexer electrically connected to each of the output type bonding pads via a corresponding electrical connection and to the second type bonding pad via a buffer and configured to select one of the output type bonding pads based on a selection signal such that the selected one of the output type bonding pads is electrically connected to the second type bonding pad; and
a plurality of latch circuits, wherein each of the input type bonding pads is configured to be electrically connected to the second type bonding pad via a respective latch circuit of the plurality of latch circuits.

15. The integrated circuit device of claim 14, further comprising a plurality of second latch circuits, each of the output type bonding pads being electrically connected to the multiplexer via a respective second latch circuit of the plurality of second latch circuits.

16. An integrated circuit device comprising:
an integrated circuit;
a first type bonding pad electrically connected to the integrated circuit, wherein the first type bonding pad is configured to be electrically connected to an external integrated circuit device; and
a second type bonding pad configured to be electrically connected to the first type bonding pad and to have no electrical connection with the external integrated circuit device,
wherein the integrated circuit device is configured to perform at least one of:

i) sending a first signal along a first signal path from the integrated circuit through the first type bonding pad to the second type bonding pad to test the first type bonding pad, wherein the integrated circuit, the first type bonding pad, and the second type bonding pad are electrically connected in series along the first signal path, or ii) receiving a second signal along a second signal path from the second type bonding pad through the first type bonding pad to the integrated circuit to test the first type bonding pad, wherein the second type bonding pad, the first type bonding pad, and the integrated circuit are electrically connected in series along the second signal path.

17. The integrated circuit device of claim 16, wherein the second type bonding pad is configured to have a size larger than the first type bonding pad.

18. The integrated circuit device of claim 16, wherein the integrated circuit is electrically connected to the first type bonding pad via a first buffer and to the second type bonding pad via a second buffer, and
wherein the second buffer is electrically connected to an electrical contact between the integrated circuit and the first buffer.

19. The integrated circuit device of claim 16, wherein the integrated circuit is configured to be electrically connected to the first type bonding pad via a first buffer, and
wherein the first type bonding pad is configured to be electrically connected to the second type bonding pad via a second buffer.

20. The integrated circuit device of claim 19, further comprising a latch circuit electrically connected to an electrical contact between the first type bonding pad and the second buffer,
wherein the latch circuit is configured to receive a control signal.

21. The integrated circuit device of claim 20, wherein the integrated circuit is configured to provide the control signal to the latch circuit.

22. The integrated circuit device of claim 20, wherein the integrated circuit is configured to provide a signal to the first type bonding pad, and
wherein the latch circuit is configured to:
update the signal from the first type bonding pad to the second type bonding pad when the control signal is at a first state, and
latch the signal from the first type bonding pad to the second type bonding pad when the control signal is at a second state different from the first state.

23. The integrated circuit device of claim 20, wherein the latch circuit is configured to receive a switching signal,
wherein the latch circuit is configured to:
electrically isolate the second type bonding pad from the first type bonding pad when the switching signal is an off signal, and
electrically connect the second type bonding pad with the first type bonding pad when the switching signal is an on signal, such that a signal from the second type bonding pad to the first type bonding pad is updated when the control signal is at a first state and the signal from the second type bonding pad to the first type bonding pad is latched when the control signal is at a second state different from the first state.

* * * * *